(12) United States Patent
Kim

(10) Patent No.: US 12,288,834 B2
(45) Date of Patent: Apr. 29, 2025

(54) LIGHT EMITTING DEVICE, LIGHT EMITTING DIODE PACKAGE, BACKLIGHT UNIT, AND LIQUID CRYSTAL DISPLAY

(71) Applicant: Seoul Semiconductor Co., Ltd., Ansan-si (KR)

(72) Inventor: Eun Ju Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 120 days.

(21) Appl. No.: 18/369,657

(22) Filed: Sep. 18, 2023

(65) Prior Publication Data
US 2024/0006562 A1 Jan. 4, 2024

Related U.S. Application Data

(63) Continuation of application No. 17/958,383, filed on Oct. 1, 2022, now Pat. No. 11,876,151, which is a (Continued)

(51) Int. Cl.
*H01L 33/46* (2010.01)
*G02F 1/1335* (2006.01)
(Continued)

(52) U.S. Cl.
CPC ........ *H01L 33/46* (2013.01); *G02F 1/133603* (2013.01); *G02F 1/133605* (2013.01);
(Continued)

(58) Field of Classification Search
CPC ..... H01L 33/46; H01L 25/0753; H01L 33/42; H01L 33/502; H01L 33/505; H01L 33/54;
(Continued)

(56) References Cited

U.S. PATENT DOCUMENTS 10,693,048 B2   6/2020   Diana et al.
10,693,049 B2   6/2020   Moon et al.
(Continued)

FOREIGN PATENT DOCUMENTS

CN   204243083 U   4/2015
CN   107390428     11/2017
(Continued)

OTHER PUBLICATIONS

British Office Action dated Oct. 7, 2022, for British Patent Application No., GB2019681,2.
(Continued)

*Primary Examiner* — Kevin Quarterman
(74) *Attorney, Agent, or Firm* — Oblon, McClelland, Maier & Neustadt, L.L.P.

(57) ABSTRACT

A display apparatus including a display panel, and a backlight to provide light toward the display panel, the backlight including a circuit board, an optical layer disposed on the circuit board, at least one light emitter disposed between the circuit board and the optical layer and including a light emitting structure disposed on the circuit board and having first and second conductivity type semiconductor layers and an active layer therebetween, first and second electrode pads electrically connected to the first and second conductivity type semiconductor layers, respectively, a reflector on the light emitting structure, a light transmitting layer disposed on the circuit board and contacting the light emitter, and a dam disposed on the circuit board and surrounding the light emitter and including a portion having a curved shape.

20 Claims, 16 Drawing Sheets

Related U.S. Application Data continuation of application No. 17/110,293, filed on Dec. 3, 2020, now Pat. No. 11,462,663, which is a continuation of application No. 17/095,066, filed on Nov. 11, 2020, now Pat. No. 11,621,376, which is a continuation of application No. PCT/KR2019/007103, filed on Jun. 12, 2019.

(60) Provisional application No. 62/702,445, filed on Jul. 24, 2018, provisional application No. 62/697,552, filed on Jul. 13, 2018, provisional application No. 62/697,078, filed on Jul. 12, 2018.

(51) Int. Cl.
| | | |
|---|---|---|
| *G02F 1/13357* | (2006.01) | |
| *H01L 25/075* | (2006.01) | |
| *H01L 33/42* | (2010.01) | |
| *H01L 33/50* | (2010.01) | |
| *H01L 33/54* | (2010.01) | |
| *H01L 33/56* | (2010.01) | |
| *H01L 33/58* | (2010.01) | |
| *H01L 33/60* | (2010.01) | |
| *H01L 33/62* | (2010.01) | |

(52) U.S. Cl.
CPC .. *G02F 1/133607* (2021.01); *G02F 1/133614* (2021.01); *H01L 25/0753* (2013.01); *H01L 33/42* (2013.01); *H01L 33/502* (2013.01); *H01L 33/505* (2013.01); *H01L 33/54* (2013.01); *H01L 33/56* (2013.01); *H01L 33/58* (2013.01); *H01L 33/60* (2013.01); *H01L 33/62* (2013.01); *H01L 2933/0025* (2013.01); *H01L 2933/0041* (2013.01); *H01L 2933/005* (2013.01); *H01L 2933/0091* (2013.01)

(58) Field of Classification Search
CPC ......... H01L 33/56; H01L 33/58; H01L 33/60; H01L 33/62; H01L 2933/0025; H01L 2933/0041; H01L 2933/005; H01L 2933/0091; H01L 33/44; H01L 2933/0033; H01L 2933/0058; H01L 33/48; H01L 33/50; H01L 25/075; H01L 33/10; G02F 1/133603; G02F 1/133605; G02F 1/133607; G02F 1/133614; G02F 1/335
See application file for complete search history.

(56) References Cited

U.S. PATENT DOCUMENTS

| | | |
|---|---|---|
| 2015/0085527 A1 | 3/2015 | Nam et al. |
| 2016/0064620 A1 | 3/2016 | Mastin et al. |
| 2016/0306101 A1 | 10/2016 | Lee |
| 2016/0349445 A1 | 12/2016 | Kim et al. |
| 2017/0294479 A1 | 10/2017 | Cha et al. |
| 2018/0114884 A1 | 4/2018 | Kim |
| 2018/0358520 A1 | 12/2018 | Moon et al. |
| 2019/0025647 A1 | 1/2019 | Cheng |
| 2019/0189595 A1 | 6/2019 | Lee et al. |
| 2020/0091376 A1 | 3/2020 | Lim et al. |

FOREIGN PATENT DOCUMENTS

| | | |
|---|---|---|
| EP | 3154096 | 4/2017 |
| JP | 2010-45248 A | 2/2010 |
| JP | 2013115088 | 6/2013 |
| KR | 10-2011-0131044 | 12/2011 |
| KR | 10-2013-0034152 | 4/2013 |
| KR | 10-2015-0095414 | 8/2015 |
| KR | 10-2017-0019551 | 2/2017 |
| WO | WO 2017062119 | 4/2017 |
| WO | WO 2017/074035 | 5/2017 |

OTHER PUBLICATIONS

German Office Action dated Oct. 18, 2022, in German Patent Application No. 112019007978.6 (with Concise English Explanation).
International Search Report issued in PCT/KR2019/007103 on Sep. 25, 2019.
Office Action dated Sep. 1, 2021, issued to Indian Patent Application No. 202037051581.
Extended European Search Report dated Jan. 7, 2022, issued in European Patent Application No. 19834306.3.
UK Examination Report dated Nov. 29, 2021, issued in UK Patent Application No. GB2019681.2.
Office Action dated Feb. 23, 2022 for Indian Patent Application No. 202038052291.
Non-Final Office Action mailed May 18, 2022, in U.S. Appl. No. 17/095,066.
Non-Final Office Action dated Dec. 15, 2021, in U.S. Appl. No. 17/110,293.
Final Office Action dated Jun. 10, 2022, in U.S. Appl. No. 17/110,293.
Notice of Allowance dated Aug. 25, 2022, in U.S. Appl. No. 17/110,293.
Combined Chinese Office Action and Search Report issued Sep. 8, 2023 in Chinese Patent Application No. 201910659758.9 (with English Translation of Category of Cited Documents), 7 pages.
Combined Chinese Office Action and Search Report issued Sep. 11, 2023 in Chinese Patent Application No. 201910659639.3 (with English Translation of Category of Cited Documents), 8 pages.
United States Notice of Allowance issued Oct. 17, 2023 in U.S. Appl. No. 17/958,383, 18 pages.
United States Notice of Allowance issued Nov. 13, 2023 in U.S. Appl. No. 17/958,383, 14 pages.
Combined Chinese Office Action and Search Report issued Dec. 29, 2023 in Chinese Patent Application No. 202011451842.0, 8 pages.

LIGHT EMITTING DEVICE, LIGHT EMITTING DIODE PACKAGE, BACKLIGHT UNIT, AND LIQUID CRYSTAL DISPLAY

CROSS-REFERENCE TO RELATED APPLICATIONS

This application is a Continuation of U.S. patent application Ser. No. 17/958,383, filed Oct. 1, 2022, which is a Continuation of U.S. patent application Ser. No. 17/110,293, filed on Dec. 3, 2020, which is a Continuation of U.S. patent application Ser. No. 17/095,066, filed on Nov. 11, 2020, which is a Bypass Continuation of International Patent Application No. PCT/KR2019/007103, filed on Jun. 12, 2019, and claims benefits of U.S. Provisional Application No. 62/697,078, filed on Jul. 12, 2018, U.S. Provisional Application No. 62/697,552, filed on Jul. 13, 2018, and U.S. Provisional Application No. 62/702,445, filed on Jul. 24, 2018, each of which is hereby incorporated by reference for all purposes as if fully set forth herein.

BACKGROUND

Field

Exemplary embodiments relate to a light emitting device, a light emitting diode package, a backlight unit, and a liquid crystal display.

Discussion of the Background

As one type of a flat panel display (FPD), a liquid crystal display (LCD) is widely used due to its display quality and high contrast ratio.

The liquid crystal display includes liquid crystals, which allow light to pass therethrough or blocking light depending upon an arrangement direction of liquid crystal molecules. The liquid crystal display has advantages of a smaller thickness and lower power consumption than other displays. The liquid crystal display displays an image through a display panel including the liquid crystals between two glass substrates. The display panel is not self-emissive, and thus, requires a backlight unit for supplying light to the display panel.

Since the liquid crystal display generally blocks light based on the arrangement of the liquid crystal molecules and polarization filters with a light source of the backlight unit kept in a turned-on state, the liquid crystal display suffers from significant power consumption. To solve this problem, the liquid crystal display may adopt local dimming. Local dimming is performed by locally adjusting the intensity of light or locally blocking light through partial adjustment of brightness of a light source, instead of blocking light based on arrangement of the liquid crystal molecules, which substantially reduces power consumption upon operation of the liquid crystal display. In addition, local dimming can further improve contrast ratio. Such local dimming may be used in a direct-lighting type backlight unit, in which the light source is disposed below the display panel, but may not be suitable for an edge-lighting type backlight unit, in which the light source is disposed on a side surface of a light guide plate.

The direct-lighting type backlight unit employs multiple light emitting diodes. The multiple light emitting diodes are arranged in a matrix below the display panel, such that light emitted from the light emitting diodes enters the display panel through an optical sheet. In this case, since the light emitting diodes are spot light sources, it is necessary to ensure uniform distribution of light emitted from the light emitting diodes. As such, there is a need for very dense arrangement of the light emitting diodes or for positioning the light emitting diodes to be spaced apart from display panel. Further, a diffusion lens may be used to achieve uniform spreading of light emitted from the light emitting diodes in a lateral direction. As such, it is generally difficult to reduce the thickness of the direct-lighting type backlight unit due to increase in distance between a light source and an optical sheet even without using the light guide plate.

Moreover, while the usage of a diffusion lens may reduce the number of light emitting diodes used in the backlight unit by increasing a region covered by one light emitting diode, such may be disadvantageous when employing local dimming as the region covered by one light emitting diode would be increased.

Moreover, in the direct-lighting type backlight unit, since light emitted from a light emitting diode chip affects a region incident with light emitted from adjacent light emitting diode chip, it is difficult to achieve a clear blackout effect in such region due to light emitted from the adjacent light emitting diode chip even when the light emitting diode chip is turned off.

Moreover, an optical device emits a greater amount of light through an upper surface thereof than through a side surface thereof. Since there is a significant difference in brightness between an upper region of the light emitting device and a peripheral region thereof, bright spots are mainly generated in the upper region of the light emitting device among the entire light emitting region of the backlight unit. Accordingly, the backlight unit adopting typical light emitting devices has a problem of low uniformity of light emitted therefrom.

The above information disclosed in this Background section is only for understanding of the background of the inventive concepts, and, therefore, it may contain information that does not constitute prior art.

SUMMARY

Light emitting devices constructed according to exemplary embodiments of the invention are capable of suppressing a spot phenomenon while improving luminous uniformity.

Exemplary embodiments also provide a light emitting diode package and a backlight unit having improved contrast ratio depending upon on/off operation of an individual light emitting diode chip.

Exemplary embodiments still provide a backlight unit having more uniform distribution of light without using a diffusion lens and being suitable for local dimming.

Exemplary embodiments yet provide a direct-lighting type backlight unit having a thin thickness.

Additional features of the inventive concepts will be set forth in the description which follows, and in part will be apparent from the description, or may be learned by practice of the inventive concepts.

A light emitting device according to an exemplary embodiment includes a light emitting diode chip, a light reflection member disposed on an upper surface of the light emitting diode chip, a light transmitting resin covering at least a side surface of the light emitting diode chip, and a light blocking member covering an upper surface of the light transmitting resin.

A light emitting diode package according to another exemplary embodiment includes a circuit board, a light emitting diode chip mounted on the circuit board, a reflection member formed on an upper surface of the light emitting diode chip, and a dam disposed on the circuit board to surround a lateral side of the light emitting diode chip, in which a side surface of the light emitting diode chip is spaced apart from the dam.

A backlight unit according to still another exemplary embodiment a light emitting diode package including a circuit board, a light emitting diode chip mounted on the circuit board, a reflection member formed on an upper surface of the light emitting diode chip, and a dam formed on the circuit board, and an optical member disposed on the light emitting diode package. The dam is disposed to surround a lateral side of the light emitting diode chip and is spaced apart from a side surface of the light emitting diode chip.

A backlight unit according to yet another exemplary embodiment includes a circuit board, a plurality of light emitting devices arranged on the circuit board, and a combined optical sheet disposed on the light emitting devices, in which each of the light emitting devices includes a distributed Bragg reflector on an upper surface thereof and is mounted on the circuit board to be independently driven.

A liquid crystal display according to another exemplary includes a backlight unit, and a display panel disposed on the backlight unit, the backlight unit including a circuit board, a plurality of light emitting devices arranged on the circuit board, and a combined optical sheet disposed on the light emitting devices, in which each of the light emitting devices includes a distributed Bragg reflector on an upper surface thereof and is mounted on the circuit board to be independently driven It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
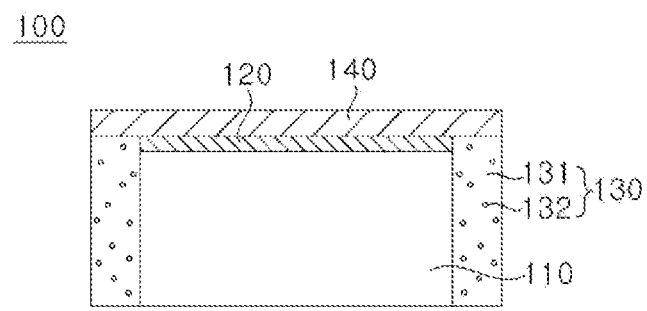
FIG. 1 is a schematic view of a light emitting device according to a first exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

According to an exemplary embodiment, a light emitting device may include: a light emitting diode chip; a light reflection member disposed on an upper surface of the light emitting diode chip; a light transmitting resin covering at least a side surface of the light emitting diode chip; and a light blocking member covering an upper surface of the light transmitting resin.

The light transmitting resin may cover the side surface of the light emitting diode chip while exposing a side surface of the light reflection member.

The light blocking member may cover the upper surface of the light transmitting resin and the side surface of the light reflection member.

In another exemplary embodiment, the light transmitting resin may cover the side surface of the light emitting diode chip and a side surface of the light reflection member.

The light blocking member may cover the upper surface of the light transmitting resin and an upper surface of the light reflection member.

Alternatively, the light blocking member may cover the upper surface of the light transmitting resin while exposing at least a portion of an upper surface of the light reflection member.

According to another exemplary embodiment, the light transmitting resin may cover the side surface of the light emitting diode chip and an upper surface of the light reflection member.

The upper surface of the light transmitting resin may have a stepped structure in which a peripheral region of the upper surface thereof has a thickness less than that in a central region of the upper surface thereof.

The light reflection member may include a metal reflector or a distributed Bragg reflector (DBR).

The light blocking member may be a white resin reflecting light.

The light emitting device may further include a wavelength conversion material dispersed in the light transmitting resin to convert a wavelength of light emitted from the light emitting diode chip.

According to an exemplary embodiment, a light emitting diode package may include: a circuit board; a light emitting diode chip mounted on the circuit board; a reflection member formed on an upper surface of the light emitting diode chip; and a dam disposed on the circuit board and surrounding a lateral side of the light emitting diode chip. A side surface of the light emitting diode chip may be spaced apart from the dam. In addition, an angle from an optical axis of a light emitting surface of the light emitting diode chip to an upper corner of an inner wall of the dam may be greater than an angle corresponding to a peak beam angle of the light emitting diode chip.

The light emitting diode package may further include a light transmitting resin covering the light emitting diode chip and the reflection member.

The transmitting resin may include a wavelength conversion material dispersed therein.

The circuit board may be integrally formed with the dam, or the dam may be separately formed on the circuit board.

The dam may be formed of a material that does not transmit light emitted from the light emitting diode chip therethrough or reflect light emitted from the light emitting diode chip.

The reflection member may include at least one layer formed of metal, a distributed Bragg reflector (DBR), or a resin including a reflective material.

A backlight unit according to an exemplary embodiment may include: a light emitting diode package and an optical member disposed on the light emitting diode package. The light emitting diode package may include a circuit board, a light emitting diode chip mounted on the circuit board, a reflection member formed on an upper surface of the light emitting diode chip, and a dam formed on the circuit board. The dam may be disposed to surround a lateral side of the light emitting diode chip and be spaced apart from a side surface of the light emitting diode chip. In addition, an angle from an optical axis of a light emitting surface of the light emitting diode chip to an upper corner of an inner wall of the dam may be greater than an angle corresponding to a peak beam angle of the light emitting diode chip.

The backlight unit may further include a light transmitting resin covering the light emitting diode chip and the reflection member.

The transmitting resin may include a wavelength conversion material dispersed therein.

The circuit board may be integrally formed with the dam, or the dam may be separately formed on the circuit board.

The dam may be formed of a material that does not transmit light emitted from the light emitting diode chip therethrough or reflect light emitted from the light emitting diode chip.

The reflection member may include at least one layer formed of metal, a distributed Bragg reflector (DBR), or a resin including a reflective material.

The light emitting diode package may be spaced apart from the optical member to form a space between the light emitting diode package and the optical member.

The backlight unit may further include a sealing member formed of a light transmitting material and filling the space between the light emitting diode package and the optical member.

The sealing member may include a light diffuser dispersed therein.

A backlight unit according to an exemplary embodiment includes: a circuit board; a plurality of light emitting devices arranged on the circuit board; and a combined optical sheet disposed on the light emitting devices, in which each of the light emitting devices includes a distributed Bragg reflector on an upper surface thereof and is mounted on the circuit board to be independently driven.

The backlight unit may further include a wavelength conversion sheet converting a wavelength of light emitted from the light emitting devices. Furthermore, the wavelength conversion sheet may be integrated into the combined optical sheet.

Each of the light emitting devices may include a wavelength conversion member disposed on a side surface thereof.

A portion of the wavelength conversion member may cover the distributed Bragg reflector.

Each of the light emitting devices may further include a light blocking member covering the wavelength conversion member.

The light blocking member may include a white resin.

The wavelength conversion member may have a stepped structure formed at least one corner thereof and the light blocking member may cover the stepped structure.

The combined optical sheet may include at least two sheets selected from among a diffusion sheet, a prism sheet, a polarization film, and a fine lens sheet.

The combined optical sheet may include at least one diffusion sheet and at least one prism sheet.

A liquid crystal display according to an exemplary embodiment includes: a backlight unit; and a display panel disposed on the backlight unit, the backlight unit including: a circuit board; a plurality of light emitting devices arranged on the circuit board; and a combined optical sheet disposed on the light emitting devices, in which each of the light emitting devices includes a distributed Bragg reflector on an upper surface thereof and is mounted on the circuit board to be independently driven.

Hereinafter, exemplary embodiments will be described in detail with reference to the accompanying drawings.

FIG. 1 is a schematic view of a light emitting device according to a first exemplary embodiment.

Referring to FIG. 1, a light emitting device 100 according to the first exemplary embodiment includes a light emitting diode chip 110, a light reflection member 120, a wavelength conversion member 130, and a light blocking member 140.

The light emitting diode chip 110 emits light through upper and side surfaces thereof. The light emitting diode chip 110 is a semiconductor device having a light emitting structure on a growth substrate. Details of the light emitting diode chip 110 will be described below.

The light reflection member 120 covers the upper surface of the light emitting diode chip 110. The light reflection member 120 reflects light emitted through the upper surface of the light emitting diode chip 110. Light emitted through the upper surface of the light emitting diode chip 110 is light generated from an active layer of the light emitting diode chip 110 and passes through the upper surface of the light emitting diode chip 110.

The light reflection member 120 reflects light passing through the upper surface of the light emitting diode chip 110, such that light is reflected back to the light emitting diode chip 110 and emitted through the side surface of the light emitting diode chip 110. In this manner, in a direct-lighting type backlight unit, light emitted from the light emitting device 100 can be broadly spread in a lateral direction, thereby increasing a luminous area of the light emitting device 100.

The light reflection member 120 may be formed of any material capable of reflecting light emitted from the light emitting diode chip 110. For example, the light reflection member 120 may be a distributed Bragg reflector (DBR). The DBR may include a dielectric layer, such as $SiO_2$, $TiO_2$, SiN, and the like, and may be formed by alternately stacking layers having different indices of refraction. Alternatively, the light reflection member 120 may include a metal reflector. For example, a metal reflection layer, such as Ag and Al, may be formed on the upper surface of the light emitting diode chip 110. Still alternatively, the light reflection member 120 may include both the DBR and the metal reflection layer.

The light reflection member 120 may be formed together with the light emitting diode chip 110 in a process of manufacturing the light emitting diode chip 110. More particularly, the light reflection member 120 may be formed before individually dicing the light emitting diode chips 110. In this case, the light emitting diode chip 110 may include the light reflection member 120. Hereinafter, the light emitting diode chip 110 having an upper surface through which light is emitted and the light reflection member 120 formed thereon will be separately described.

The wavelength conversion member 130 converts the wavelength of light emitted from the light emitting diode chip 110. According to the illustrated embodiment, the wavelength conversion member 130 covers the side surface of the light emitting diode chip 110 and a side surface of the light reflection member 120.

The wavelength conversion member 130 includes a light transmitting resin 131 and a wavelength conversion material 132 dispersed in the light transmitting resin 131. For example, the light transmitting resin 131 may be formed of a light transmitting material well known in the art, such as an epoxy resin, a silicone resin, and the like, and the wavelength conversion material 132 may include phosphors or quantum dots. The phosphor refers to an inorganic or organic compound that converts light absorbed from the light emitting diode chip 110 into light having a different wavelength depending upon a difference in energy level of a compound constituting the phosphor. The quantum dot refers to a semiconductor nanocrystal that converts the absorbed light into light having a different wavelength depending upon the magnitude of a band gap.

The wavelength of light emitted through the light emitting diode chip 110 is converted by the wavelength conversion member 130, which covers the side surfaces of the light emitting diode chip 110 and the light reflection member 120. Accordingly, light subjected to wavelength conversion by the wavelength conversion material is emitted through the side surface of the light emitting device 100. Furthermore, some fraction of light emitted from the light emitting diode chip 110 may be emitted through the side surface of the light emitting device 100 without wavelength conversion.

According to the illustrated exemplary embodiment, since the light emitting device 100 emits light subjected to wavelength conversion, a separate wavelength conversion sheet may be obviated from a display apparatus. The wavelength conversion member 130 may not only convert the wavelength of light, but also protect the light emitting diode chip 110 from external materials, such as moisture, dust, and the like. In addition, the wavelength conversion member 130 may protect the light emitting diode chip 110 from external impact.

Although the light emitting device 100 according to the illustrated exemplary embodiment includes the wavelength conversion member 130 that has the wavelength conversion material 132 dispersed in the light transmitting resin 131, the inventive concepts are not limited thereto. For example, in some exemplary embodiments, the wavelength conversion material 132 may be omitted depending upon a desired color of light.

The light blocking member 140 may cover an upper surface of the wavelength conversion member 130 and an upper surface of the light reflection member 120. The light blocking member 140 may reflect or absorb light passing through the upper surface of the wavelength conversion member 130. For example, the light blocking member 140 may include a metal layer, a DBR, or a white resin. The white resin may be obtained by depositing or coating a white paint onto a resin or by dispersing a reflective material in a resin. Alternatively, the light blocking member 140 may be obtained by depositing or coating a black paint onto a resin or by dispersing a light absorbing material in a resin to block light by absorption.

Accordingly, the light blocking member 140 may cause wavelength converted light to be broadly spread in a lateral direction by blocking light emitted from the light emitting diode chip 110 in an upward direction thereof through the wavelength conversion member 130.

The light blocking member 140 may also prevent light emitted from the light emitting device 100 from being reabsorbed by the light emitting device 100. For example, the light blocking member 140 may prevent light reflected by an optical sheet disposed on the light emitting device 100 from being reabsorbed into the light emitting diode chip 110 through the upper surface of the wavelength conversion member 130 and the upper surface of the light emitting diode chip 110. In particular, the light blocking member 140 formed of a reflective layer or a white resin may reflect light that has been reflected back to the light emitting device 100 by the optical sheet, thereby improving luminous efficacy.

According to the illustrated exemplary embodiment, the light emitting device 100 includes the light reflection member 120 and the light blocking member 140 disposed on the light emitting diode chip 110. The light reflection member 120 and the light blocking member 140 may efficiently prevent discharge of light or reabsorption of external light through the upper surface of the light emitting diode chip 110. As such, the light emitting device 100 emits light substantially through the side surface thereof, thereby ensuring broad distribution of light.

Hereinafter, descriptions of the components forming the light emitting device 100 already made above will be given in brief or omitted.

Figure 2:
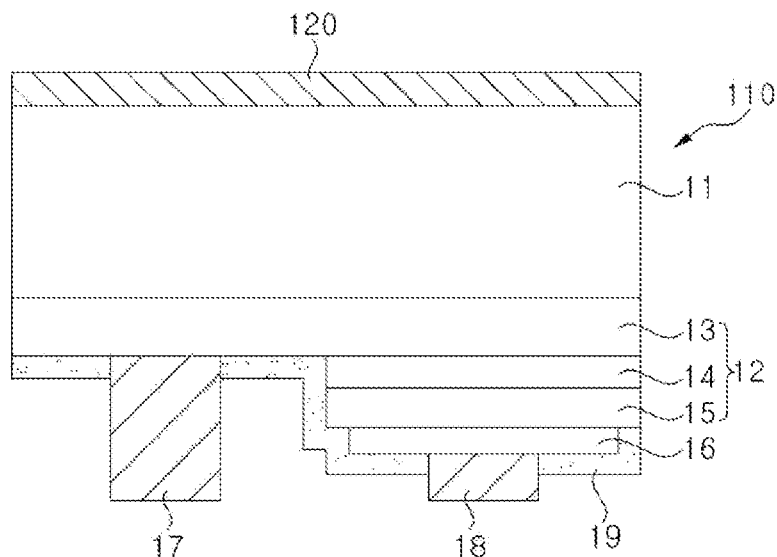
FIG. 2 is a schematic view of a light emitting diode chip and a reflection member according to an exemplary embodiment.

FIG. 2 is a schematic view of a light emitting diode chip and a reflection member according to an exemplary embodiment.

The light emitting diode chip 110 and the light reflection member 120 according to the illustrated exemplary embodiment are substantially the same as the light emitting diode chip and the light reflection member of the light emitting device described above with reference to FIG. 1.

The light emitting diode chip 110 according to the illustrated exemplary embodiment has a horizontal structure in which both electrodes are formed at a lower side thereof.

Referring to FIG. 2, the light emitting diode chip 110 may include a substrate 11, a light emitting structure 12, a transparent electrode layer 16, a first electrode pad 17, a second electrode pad 18, and a reflective layer 19.

The substrate 11 may be transparent. For example, the substrate 11 may be a sapphire substrate or a SiC substrate. Alternatively, the substrate 11 may be a growth substrate, for example, a patterned sapphire substrate (PSS), which is suitable for growth of GaN-based compound semiconductor layers thereon.

The light emitting structure 12 is disposed at a lower side of the substrate 11. The light emitting structure 12 includes a first conductivity type semiconductor layer 13, a second conductivity type semiconductor layer 15, and an active layer 14 interposed between the first conductivity type semiconductor layer 13 and the second conductivity type semiconductor layer 15. The first conductivity type and the second conductivity type may have opposite conductivities, and the first conductivity type may be n-type and the second conductivity type may be p-type, or vice versa.

Each of the first conductivity type semiconductor layer 13, the active layer 14, and the second conductivity type semiconductor layer 15 may be formed of a GaN-based compound semiconductor material. Each of the first conductivity type semiconductor layer 13 and the second conductivity type semiconductor layer 15 may be formed as a single layer, as shown in FIG. 2. Alternatively, at least one of the first conductivity type semiconductor layer 13 and the second conductivity type semiconductor layer 15 may have a multilayer structure. The active layer 14 may have a single quantum well structure or a multi-quantum well structure. In some exemplary embodiments, a buffer layer may be formed between the substrate 11 and the first conductivity type semiconductor layer 13.

The first conductivity type semiconductor layer 13, the second conductivity type semiconductor layer 15, and the active layer 14 may be formed by metal organic chemical vapor deposition (MOCVD) or molecular beam epitaxy (MBE). Further, the second conductivity type semiconductor layer 15 and the active layer 14 may be subjected to patterning through photolithography and etching so as to expose some regions of the first conductivity type semiconductor layer 13. In this case, some portions of the first conductivity type semiconductor layer 13 may also be subjected to patterning.

The transparent electrode layer 16 is disposed on a lower surface of the second conductivity type semiconductor layer 15. For example, the transparent electrode layer 16 may be formed of ITO, ZnO, or Ni/Au. The transparent electrode layer 16 has lower specific resistance than the second conductivity type semiconductor layer 15 to facilitate electric current distribution.

The first electrode pad 17 is disposed on a lower surface of the first conductivity type semiconductor layer 13, and the second electrode pad 18 is disposed on a lower surface of the transparent electrode layer 16. The second electrode pad 18 is electrically connected to the second conductivity type semiconductor layer 15 through the transparent electrode layer 16.

The reflective layer 19 covers the lower surface of the light emitting structure 12 excluding the first electrode pad 17 and the second electrode pad 18. In addition, the reflective layer 19 covers the side surfaces of the active layer 14 and the second conductivity type semiconductor layer 15, which are exposed by patterning to expose the first conductivity type semiconductor layer 13.

The reflective layer 19 reflects light generated from the active layer 14 and traveling towards the second electrode pad 18 to the upper surface or the side surface of the light emitting diode chip 110. As such, the reflective layer 19 causes all fractions of light generated from the light emitting structure 12 to be emitted only through a light emitting surface of the light emitting diode chip 110.

The reflective layer 19 may be an insulation layer including a single DBR layer or multiple DBR layers, or may be a metal layer surrounded by the insulation layer. The location and structure of the reflective layer 19 are not limited that shown in FIG. 2, and may be modified in various ways so long as the reflective layer 19 can reflect light traveling towards the second electrode pad 18.

The light reflection member 120 is disposed on the upper surface of the light emitting diode chip 110. The light reflection member 120 may be formed to cover the entire upper surface of the substrate 11.

Light traveling towards the upper surface of the light emitting diode chip 110 is reflected by the light reflection member 120 to be emitted through the side surface of the light emitting diode chip 110.

In some exemplary embodiments, ohmic contact layers for ohmic contact may be disposed between the first conductivity type semiconductor layer 13 and the first electrode pad 17, and between the second conductivity type semiconductor layer 15 and the second electrode pad 18.

Figure 3:
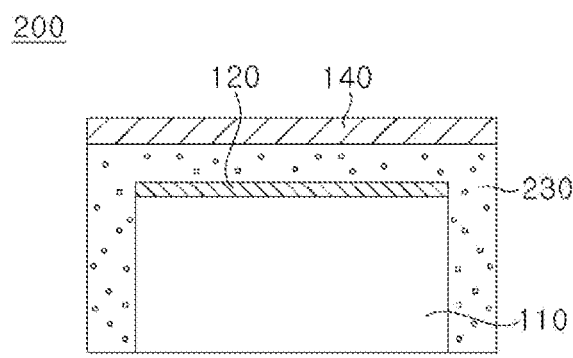
FIG. 3 is a schematic view of a light emitting device according to a second exemplary embodiment.

FIG. 3 is a schematic view of a light emitting device according to a second exemplary embodiment.

Referring to FIG. 3, a light emitting device 200 according to the illustrated exemplary embodiment includes a light emitting diode chip 110, a light reflection member 120, a wavelength conversion member 230, and a light blocking member 140.

The wavelength conversion member 130 of FIG. 1 exposes the upper surface of the light reflection member 120, however, the wavelength conversion member 230 according to the illustrated exemplary embodiment covers the upper surface of the light reflection member 120. More particularly, the wavelength conversion member 230 is formed to cover the side surface of the light emitting diode chip 110 and the upper and side surfaces of the light reflection member 120. The light blocking member 140 covers the upper surface of the wavelength conversion member 230 and is spaced apart from the light reflection member 120 by the wavelength conversion member 230.

IAs such, the light emitting device 200 according to the illustrated exemplary embodiment has a structure in which the wavelength conversion member 230 is disposed not only on the side surface of the light emitting diode chip 110 but also between the light reflection member 120 and the light blocking member 140.

The wavelength conversion member 230 disposed between the light blocking member 140 and the light reflection member 120 may have the same thickness as the thickness of the wavelength conversion member 230 formed on the side surface of the light emitting diode chip 110, without being limited thereto. In some exemplary embodiments, the thickness of the wavelength conversion member 230 disposed between the light blocking member 140 and the light reflection member 120 may be less than the thickness of the wavelength conversion member 230 formed on the side surface of the light emitting diode chip 110. For example, the thickness of the wavelength conversion member 230 disposed between the light blocking member 140 and the light reflection member 120 may be about half or less the thickness of the wavelength conversion member 230 formed on the side surface of the light emitting diode chip 110. As another example, when the wavelength conversion member 230 formed on the side surface of the light emitting diode chip 110 has a thickness of 100 μm, the wavelength conversion member 230 disposed between the light blocking member 140 and the light reflection member 120 may have a thickness of 50 μm or less.

As the thickness of the wavelength conversion member 230 disposed between the light blocking member 140 and the light reflection member 120 is decreased, light traveling towards the upper surface of the light emitting device 200 may be more efficiently blocked. Accordingly, a backlight unit employing the light emitting device 200 according to the illustrated exemplary embodiment can achieve more uniform distribution of light emitted therefrom.

In the light emitting device 100 of FIG. 1, the light blocking member 140 contacts the light reflection member 120. Accordingly, the light reflection member 120 is exposed until the light blocking member 140 is formed thereon, and thus, the light reflection member 120 can be damaged during manufacture. In addition, when the light emitting device 200 is subjected to external impact, the light reflection member 120 can be separated from the light emitting diode chip 110.

In the light emitting device 200 according to the illustrated exemplary embodiment, the wavelength conversion member 230 covers both the light emitting diode chip 110 and the light reflection member 120, thereby preventing the light blocking member 140 from being exposed and damaged, while preventing the light reflection member 120 from being separated from the light emitting diode chip 110 by external impact.

Figure 4:
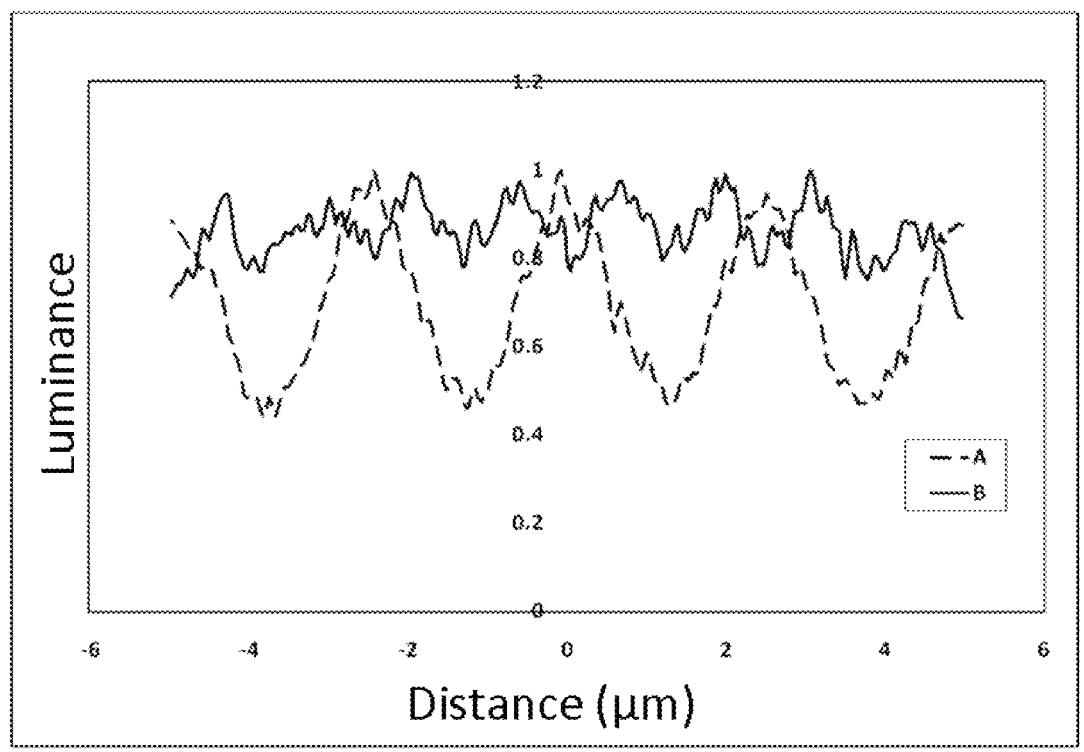
FIG. 4 is a graph depicting brightness of a light emitting device according to an exemplary embodiment and a conventional light emitting device.

FIG. 4 is a graph depicting brightness of a light emitting device according to an exemplary embodiment and a conventional light emitting device.

The graph of FIG. 4 depicts brightness depending upon a separation distance from a center of the light emitting device.

In FIG. 4, A is a graph depicting brightness of a light emitting device according to a comparative example and B is a graph depicting brightness of the light emitting device according to an exemplary embodiment.

The light emitting device B according to an exemplary embodiment includes a wavelength conversion member 230 disposed between a light reflection member 120 and a light blocking member 140, as in the light emitting device 200 shown in FIG. 3. The wavelength conversion member 230 disposed on an upper surface of the light reflection member 120 has a thickness of 100 μm. Further, the wavelength conversion member 230 disposed on a side surface of the light emitting diode chip 110 has a thickness of 100 μm. Further, the light blocking member 140 is disposed to cover an upper surface of the wavelength conversion member 230.

The light emitting device A according to the comparative example includes a light emitting diode chip 110, a light reflection member 120 disposed on an upper surface of the light emitting diode chip, and a wavelength conversion member 230 covering the light emitting diode chip and the light reflection member.

As such, the light emitting device A of the comparative example does not include the light blocking member 140 of the light emitting device B according to an exemplary embodiment.

The light emitting device A of the comparative example exhibits the maximum brightness and the minimum brightness repeated at constant intervals, in which there is a relatively large difference between the maximum brightness and the minimum brightness. In this case, the peak of the graph exhibiting the maximum brightness in each interval corresponds to an upper portion of the light emitting diode chip. As such, the light emitting device A of the comparative example has a large difference in brightness between the upper portion of the light emitting diode chip and a peripheral region thereof. As such, it can be seen that even with the light reflection member 120, the light emitting device A of the comparative example suffers from a spot phenomenon due to concentration of light on an upper region of the light emitting diode chip, thereby exhibiting low luminous uniformity.

The light emitting device B according to an exemplary embodiment has a smaller difference between the maximum brightness and the minimum brightness than the light emitting device A of the comparative example. As can be seen from the graph, the light emitting device B according to the illustrated exemplary embodiment has insignificant difference in brightness between the upper portion of the light emitting diode chip and the peripheral region thereof. Accordingly, the light emitting device B according to the illustrated exemplary embodiment can suppress the spot phenomenon and improve luminous uniformity.

As such, by comparison of the light emitting device B according to the illustrated exemplary embodiment with the light emitting device A of the comparative example, it can be seen that the light blocking member suppresses concentration of light on the upper portion of the light emitting diode chip. Thus, the light emitting device employing the light blocking member has improved luminous uniformity.

Figure 5:
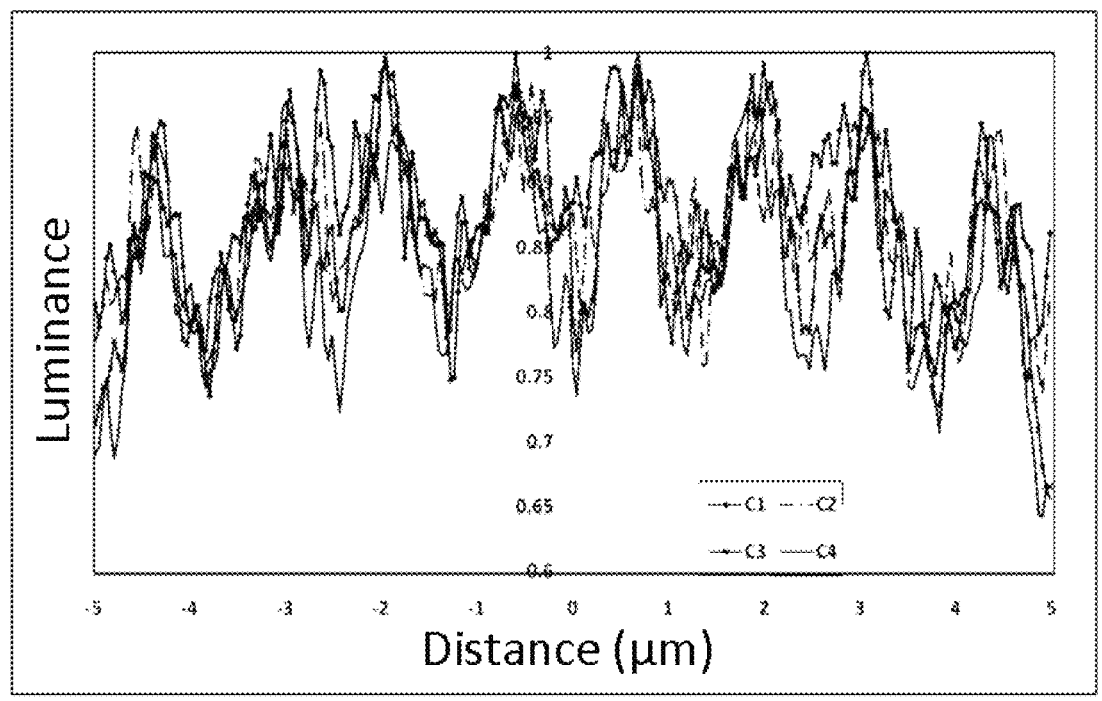
FIG. 5 is a graph depicting brightness of a light emitting device according to exemplary embodiments with a varying thickness of a wavelength conversion member.

FIG. 5 is a graph depicting brightness of the light emitting device depending upon a thickness of the wavelength conversion member between the light reflection member and the light blocking member.

C1 is a graph depicting brightness of the light emitting device according to the first exemplary embodiment shown in FIG. 1. More particularly, C1 depicts brightness of the light emitting device in which the light reflection member 120 closely contacts the light blocking member 140. C2 to C4 are graphs depicting brightness of the light emitting device 200 according to the second exemplary embodiment. More particularly, the wavelength conversion member 230 between the light reflection member 120 and the light blocking member 140 has a thickness of 50 μm in C2, 100 μm in C3, and 150 μm in C4. Further, the wavelength conversion member 230 formed on the side surface of the light emitting diode chip 110 has a thickness of 100 μm in C1 to C4.

The light emitting device has a luminous uniformity of 74% in C1, 73% in C2, 67% in C3, and 64% in C4. As such, it can be seen that luminous uniformity of the light emitting device is improved as the thickness of the wavelength conversion member between the light reflection member and the light blocking member decreases.

Furthermore, for the light emitting device to have a uniform light distribution of 70% or more, the wavelength conversion member between the light reflection member and the light blocking member has a thickness of about 50 μm or less.

Figure 6:
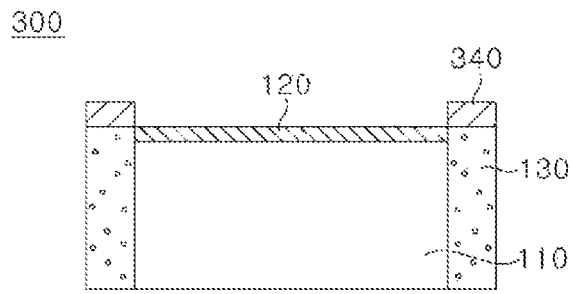
FIG. 6 and FIG. 7 are schematic views of light emitting devices according to third and fourth exemplary embodiments.
Figure 7:
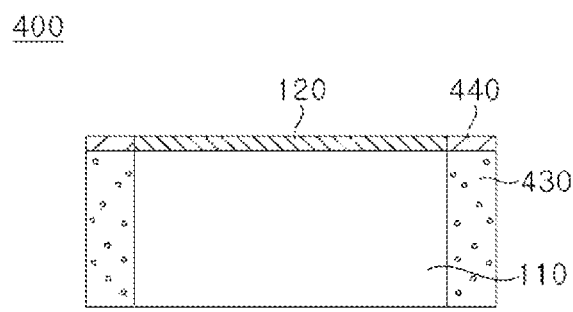

FIG. 6 and FIG. 7 are schematic views of light emitting devices according to third and fourth exemplary embodiments.

Each of the light emitting devices 300, 400 according to the third and fourth exemplary embodiments includes a light emitting diode chip 110, a light reflection member 120, a wavelength conversion member 130; 430, and a light blocking member 340; 440.

Referring to FIG. 6, the wavelength conversion member 130 covers a side surface of the light emitting diode chip 110 and a side surface of the light reflection member 120. The light blocking member 340 covers an upper surface of the wavelength conversion member 130 while exposing an upper surface of the light reflection member 120.

Although light emitted from the light emitting diode chip 110 is reflected by the light reflection member 120, some fractions of light may travel upwards through the wavelength conversion member 130. Accordingly, the light blocking member 340 may be disposed in a ring shape so as to block light emitted through the upper surface of the wavelength conversion member 130.

Referring to FIG. 7, in the fourth exemplary embodiment, the wavelength conversion member 430 covers the side surface of the light emitting diode chip 110 but does not cover the side surface of the light reflection member 120. The light blocking member 440 is disposed on the upper surface of the wavelength conversion member 430 to cover the upper surface of the wavelength conversion member 430 and the side surface of the light reflection member 120.

As such, in the light emitting devices 300, 400 according to the third and fourth exemplary embodiments, the light blocking members 340, 440 are formed only on the upper surfaces of the wavelength conversion members 130, 430, respectively. In this manner, material costs for the wavelength conversion members 130, 430 may be reduced in the light emitting devices 300, 400, as compared with a structure having the light blocking member 340; 440 formed on the entire upper surfaces of the wavelength conversion member 130; 430 and the light reflection member 120.

Figure 8:
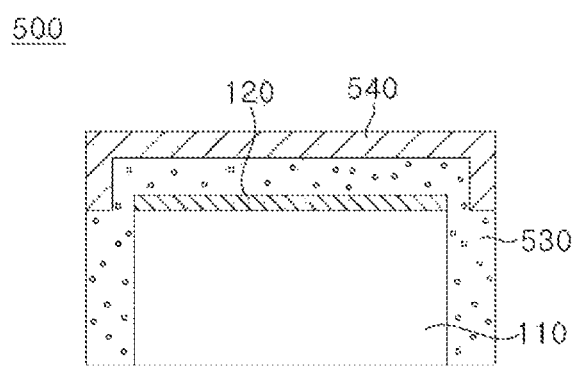
FIG. 8 is a schematic view of a light emitting device according to a fifth exemplary embodiment.

FIG. 8 is a view of a light emitting device according to a fifth exemplary embodiment.

The light emitting device 500 according to the fifth exemplary embodiment includes a light emitting diode chip 110, a light reflection member 120, a wavelength conversion member 530, and a light blocking member 540.

Referring to FIG. 8, the wavelength conversion member 530 covers a side surface of the light emitting diode chip 110 and upper and side surfaces of the light reflection member 120. The upper surface of the wavelength conversion member 530 has a stepped structure, in which a peripheral region of the upper surface thereof has a smaller thickness than a central region of the upper surface thereof.

The light blocking member 540 covers the upper surface of the wavelength conversion member 530, and may fill a stepped portion of the wavelength conversion member 530.

In this manner, a contact area between the wavelength conversion member 530 and the light blocking member 540 is increased by the wavelength conversion member 530 having the stepped structure. Increase in contact area between the wavelength conversion member 530 and the light blocking member 540 enhances the bonding strength therebetween. As such, the light emitting device 500 can have improved durability through enhanced bonding strength between the wavelength conversion member 530 and the light blocking member 540. Furthermore, since the light blocking member 540 is disposed on the stepped portion formed along the edge of the wavelength conversion member 530 while covering the upper surface of the wavelength conversion member 530, light emitted through the upper surface of the wavelength conversion member 530 may be effectively blocked.

Figure 9:
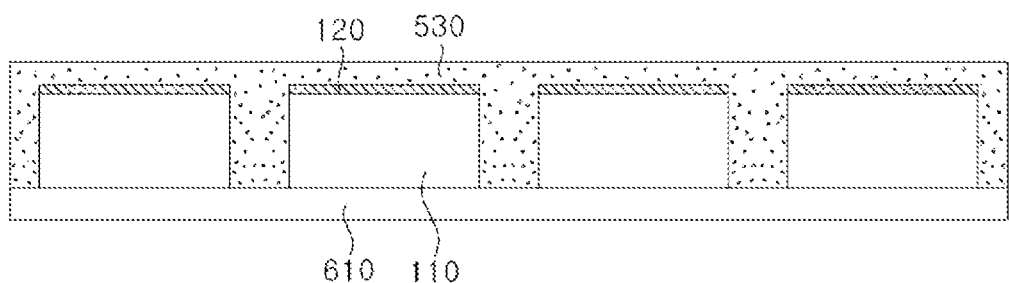
FIG. 9, FIG. 10, and FIG. 11 are schematic views illustrating a method of manufacturing the light emitting device according to the fifth exemplary embodiment.
Figure 10:
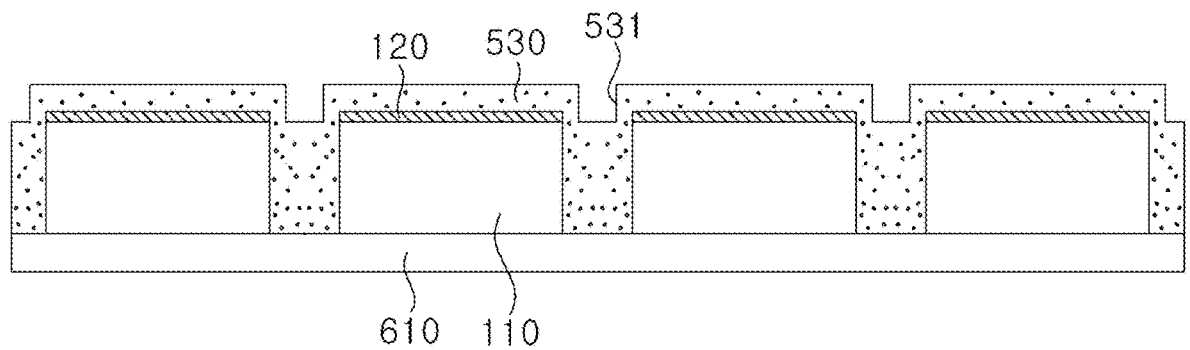
Figure 11:
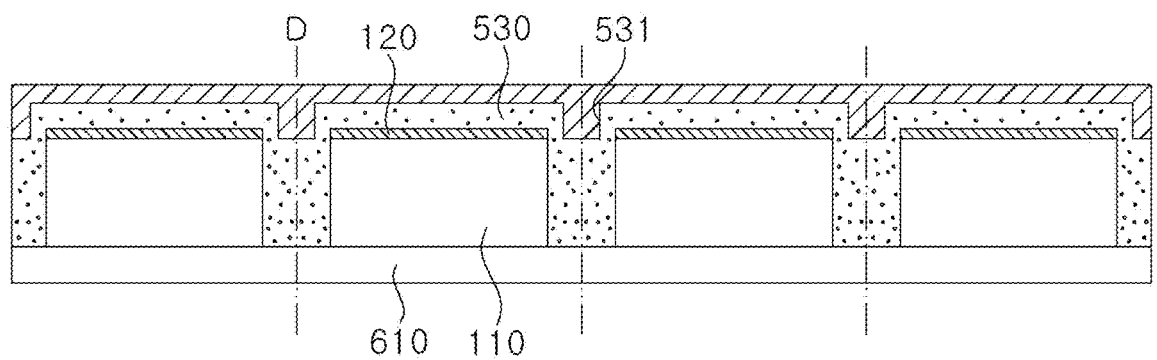

FIG. 9 to FIG. 11 are schematic views illustrating a method of manufacturing the light emitting device according to the fifth exemplary embodiment.

Referring to FIG. 9, multiple light emitting diode chips 110 are mounted on a support member 610. Then, a wavelength conversion member 530 is formed to cover the multiple light emitting diode chips 110.

Referring to FIG. 10, trenches 531 are formed in regions of the wavelength conversion member 530 disposed between the multiple light emitting diode chips 110. The trenches 531 may be formed by laser beams, exposure, cutting, and the like, depending upon the material of the wavelength conversion member 530.

Referring to FIG. 11, a light blocking member 540 is formed on the upper surface of the wavelength conversion member 530. For example, the light blocking member 540 may be formed by depositing a resin having good flowability on the upper surface of the wavelength conversion member 530. In this manner, the trenches 531 of the wavelength conversion member 530 are filled with the light blocking member 540. Thereafter, the light blocking member 540 may be secured after a predetermined period of time or by a separate process.

After formation of the light blocking member 540, dicing is performed to separate adjacent light emitting diode chips 110 from each other along a dicing line D shown in FIG. 11. After the dicing process, the support member 610 is removed from the light emitting diode chips, thereby providing the light emitting device 500 according to the fifth exemplary embodiment.

Figure 12:
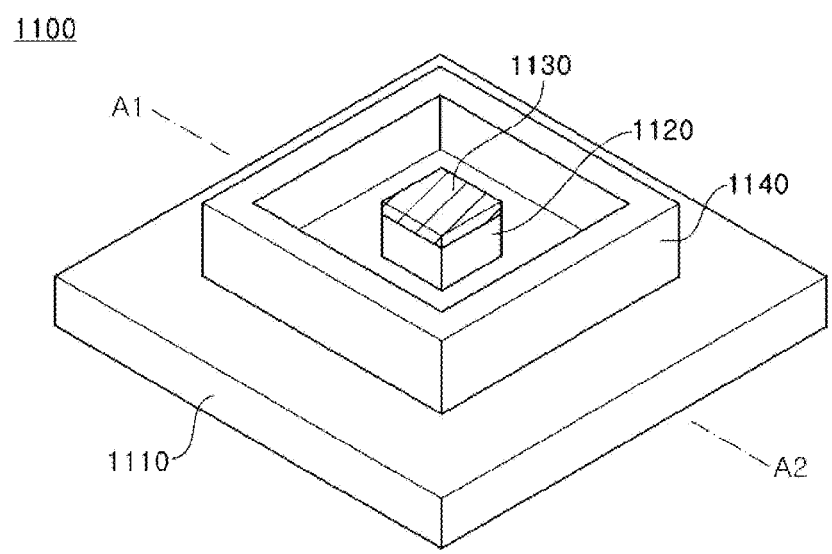
FIG. 12 and FIG. 13 are schematic views of a light emitting diode package according to a first exemplary embodiment.
Figure 13:
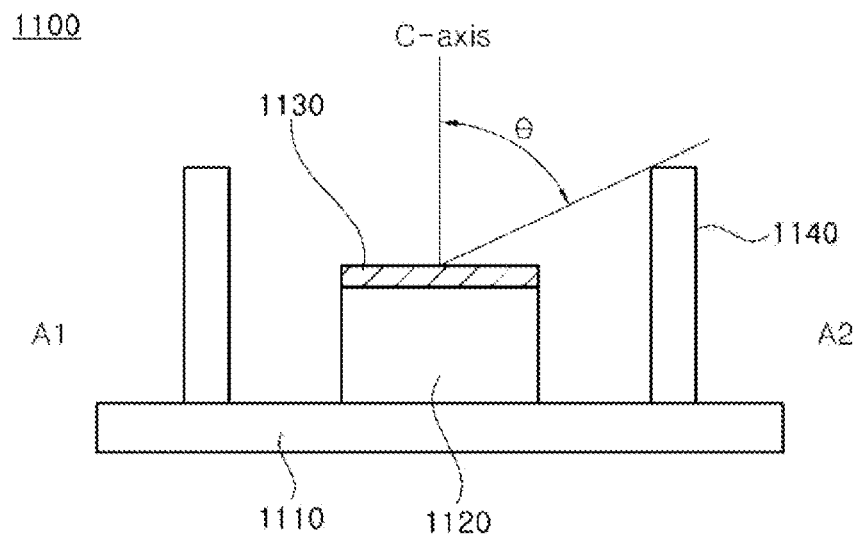

FIG. 12 and FIG. 13 are schematic views of a light emitting diode package according to a first exemplary embodiment.

FIG. 12 is a perspective view of the light emitting diode package according to the first exemplary embodiment. FIG. 13 is a cross-sectional view of the light emitting diode package according to the first exemplary embodiment.

The light emitting diode package 1100 according to the first exemplary embodiment includes a circuit board 1110, a light emitting diode chip 1120, a reflection member 1130, and a dam 1140.

The circuit board 1110 supplies electric power to the light emitting diode chip 1120. The circuit board 1110 may include an insulating resin and an interconnection pattern formed on the insulating resin. For example, the circuit board 1110 may be selected from any circuit boards, such as a printed circuit board (PCB), a metal PCB, a flexible printed circuit board (FPCB), and the like.

The light emitting diode chip 1120 is disposed on the circuit board 1110. The light emitting diode chip 1120 emits light upon application of electric power thereto through the circuit board 1110. According to an exemplary embodiment, the light emitting diode chip 1120 emits light through upper and side surfaces thereof. For example, the light emitting diode chip 1120 is a semiconductor device having a light emitting structure on a growth substrate. The light emitting diode chip 1120 is connected to the circuit board 1110 through flip-chip bonding, without being limited thereto.

The reflection member 1130 is formed to cover the upper surface of the light emitting diode chip 1120. The reflection member 1130 reflects light passing through the upper surface of the light emitting diode chip 1120, such that light is emitted to the outside through the side surface of the light emitting diode chip 1120.

The reflection member 1130 may be formed of any material capable of reflecting light. The reflection member 1130 may include a distributed Bragg reflector (DBR). For example, the DBR forming the reflection member 1130 may have a monolayer structure of $SiO_2$, $TiO_2$, SiN, or TiN. Alternatively, the DBR may have a multilayer structure formed by stacking at least two layers selected from among $SiO_2$, $TiO_2$, SiN, and TiN layers. Still alternatively, the reflection member 1130 may be formed of metal, such as Ag, Al, and the like. In some exemplary embodiments, the reflection member 1130 may include both the DBR and a metal layer.

According to the illustrated exemplary embodiment, the reflection member 1130 is formed on the upper surface of the light emitting diode chip 1120, thereby improving spreading of light in the lateral direction of the light emitting diode chip 1120. As spreading of light in the lateral direction of the light emitting diode chip 1120 is improved, light emitted from one light emitting diode chip 1120 can be spread over a broader region. In this manner, the light emitting diode package 1100 can reduce the number of light emitting diode chips 1120.

The dam 1140 is disposed to surround a lateral side of the light emitting diode chip 1120 on the circuit board 1110. The dam 1140 is separated from the side surface of the light emitting diode chip 1120. In particular, the light emitting diode chip 1120 is placed in a certain region defined by the dam 1140.

The dam 1140 may not transmit light emitted from the light emitting diode chip 1120 therethrough. Accordingly, the dam 1140 allows at least some fraction of light emitted from the light emitting diode chip 1120 to spread only inside a particular region. Further, the dam 1140 may prevent at least some fraction of light emitted from another light emitting diode chip 1120 from spreading into the particular region.

Referring to FIG. 12 and FIG. 13, the dam 1140 is separately formed on the circuit board 1110. More particularly, the dam 1140 may be formed as a separate component from the circuit board 1110, as shown in FIG. 13. The dam 1140 may include a different material than the circuit board 1110. For example, the dam 1140 may be formed of a silicone resin.

Alternatively, the dam 1140 may be integrally formed with the circuit board 1110. In this case, the dam 1140 may be formed of the same material as the circuit board 1110.

The dam 1140 may be formed to have a height capable of maintaining beam angle characteristics of the light emitting diode package 1100 including the dam 1140 to be similar to beam angle characteristics of a light emitting diode package that does not include the dam 1140.

Figure 14:
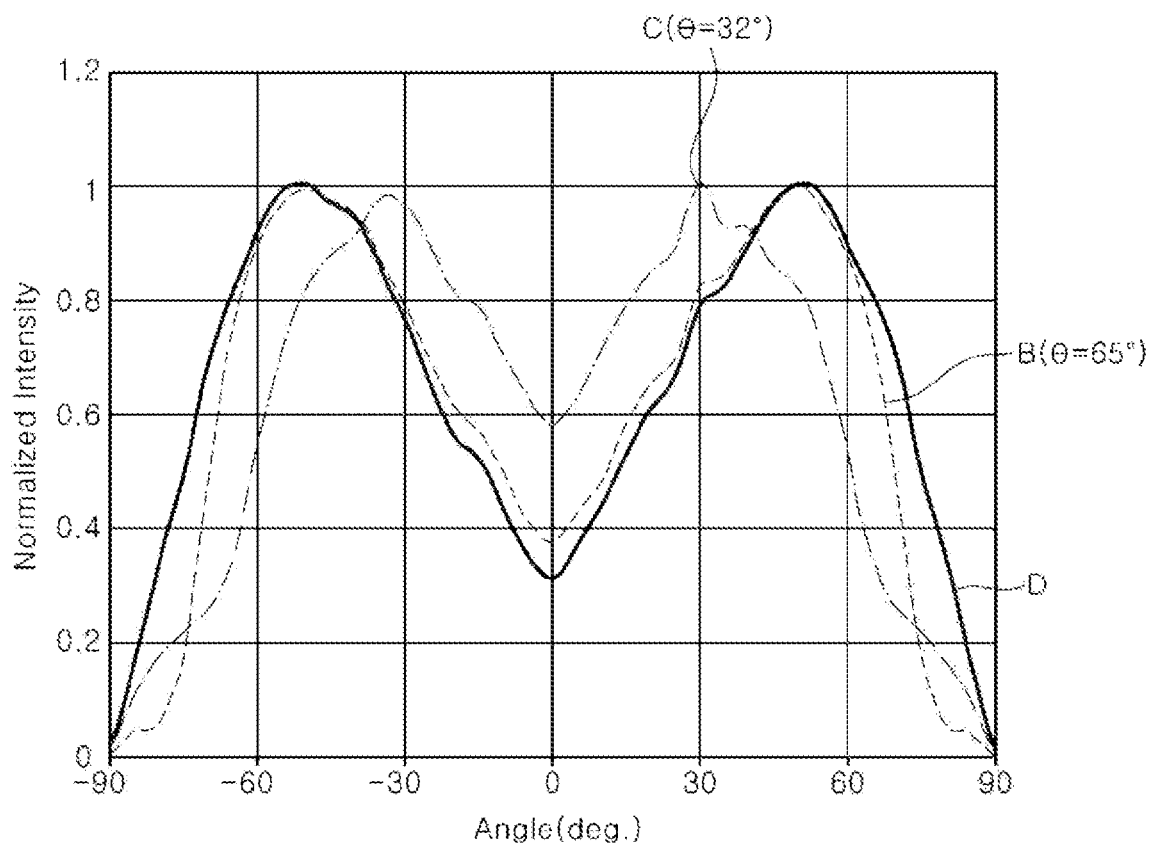
FIG. 14 is a graph depicting beam angle depending upon angle ($\theta$) from a light emitting surface to an inner wall of a dam.

FIG. 14 is a graph depicting beam angle depending upon an angle ($\theta$) from an optical axis (C-axis) of the light emitting surface to an upper corner of an inner wall of the dam 1140.

FIG. 14 shows beam angles of light emitting diode packages, in which an angle ($\theta$) defined between the light emitting surface and the dam 1140 is 65° (B), 35° (C.), and the dam 1140 is not formed (D).

When the angle ($\theta$) defined between the light emitting surface and the dam 1140 is 65° (B), the light emitting diode package has a peak beam angle ($\theta$ peak) of 48° to 54°, which is similar to the beam angle of the light emitting diode package not including the dam 1140.

When the angle defined between the light emitting surface and the dam 1140 is 35°, the light emitting diode package has a peak beam angle ($\theta$ peak) of 30° to 36°, which is different from the beam angle of the light emitting diode package not including the dam 1140.

Accordingly, the dam 1140 is formed to have a height at which the angle ($\theta$) from the optical axis of the light emitting surface to the upper corner of the inner wall of the dam is greater than the peak beam angle of the light emitting diode chip 1120.

The reflection member 1130 is formed on the upper surface of the light emitting diode chip 1120 to allow emission of light over a broad region. When the light emitting diode package includes the multiple light emitting diode chips 1120, light emitted from adjacent light emitting diode chip 1120 overlaps in some regions thereof. Accordingly, even when one light emitting diode chip 1120 does not operate, some fraction of light emitted from another light emitting diode chip 1120 adjacent thereto spreads to a region where the one light emitting diode chip 1120 is disposed. In this case, clear blackout in that region where the light emitting diode chip 1120 is disposed may not be obtained due to light emitted from the adjacent light emitting diode chip 1120.

According to the illustrated exemplary embodiment, the dam 1140 may restrict a region, in which at least some fraction of light emitted from the light emitting diode chip 1120 can be spread. More particularly, the dam 1140 reduces an influence of light emitted from an adjacent light emitting diode chip 1120 disposed outside the dam 1140 on a particular region defined by the dam 1140. Accordingly, when the light emitting diode chip 1120 disposed in the particular region defined by the dam 1140 is turned off and does not emit light, clear blackout of the particular region may be achieved.

Figure 15:
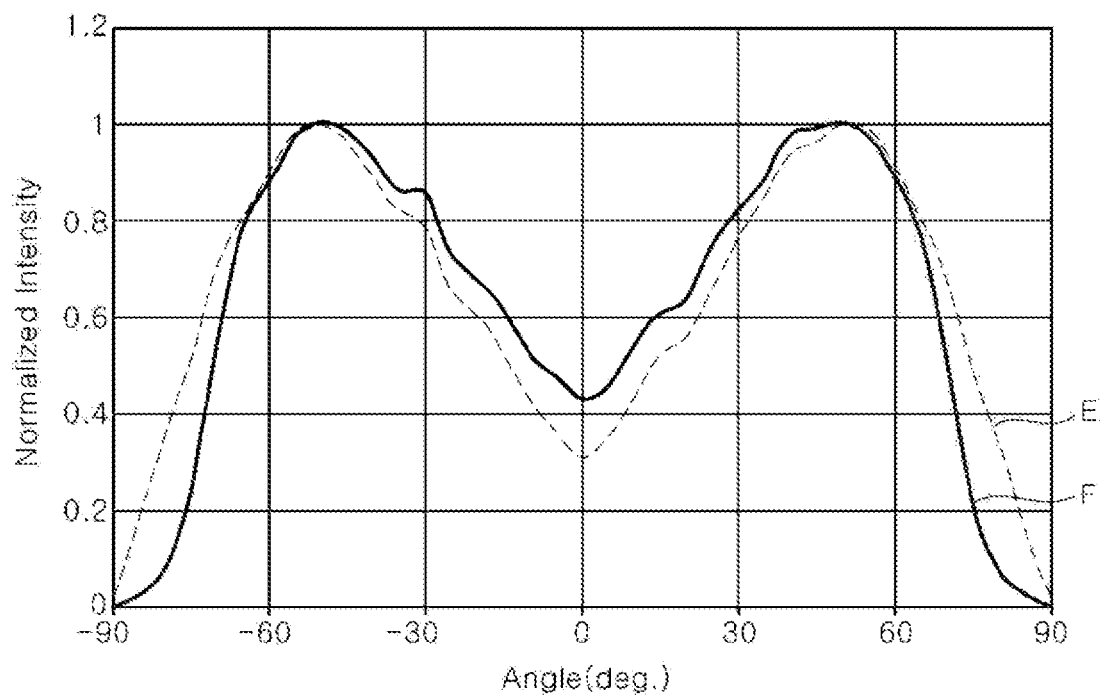
FIG. 15 is a graph comparing beam angle of the light emitting diode package according to the first exemplary embodiment with beam angle of a conventional light emitting diode package.

FIG. 15 is a graph comparing beam angle of the light emitting diode package according to the first exemplary embodiment with beam angle of a conventional light emitting diode package.

The light emitting diode package according to the first exemplary embodiment includes the dam formed on the circuit board and surrounding the lateral side of the light emitting diode chip.

The conventional light emitting diode package does not include the dam on the circuit board.

Both the light emitting diode package according to the first exemplary embodiment and the typical conventional emitting diode package include a reflection member formed on the upper surface of the light emitting diode chip.

Referring to FIG. 15, in a graph E depicting the beam angle of the light emitting diode package according to the first exemplary embodiment and a graph F depicting the beam angle of the conventional light emitting diode package, the peak point is exhibited at the same angle. However, it can be seen that the light emitting diode package according to the first exemplary embodiment has a narrower light emission zone than the conventional light emitting diode package. As such, it can be seen that the light emitting diode package according to the first exemplary embodiment restricts a light spreading range using the dam while maintaining optical characteristics, such as a light peak point.

Figure 16:
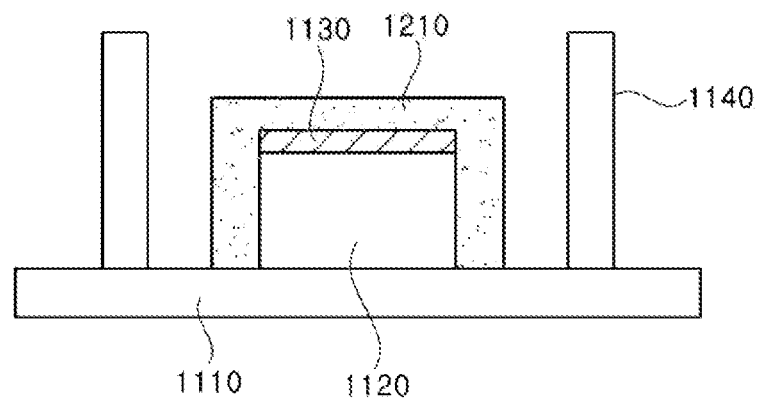
FIG. 16 is a schematic view of a light emitting diode package according to a second exemplary embodiment.

FIG. 16 is a schematic view of a light emitting diode package according to a second exemplary embodiment.

Referring to FIG. 16, the light emitting diode package 1200 according to the second exemplary embodiment includes a circuit board 1110, a light emitting diode chip 1120, a light transmitting resin 1210, a reflection member 1130, and a dam 1140.

The light transmitting resin 1210 is formed on the circuit board 1110 to surround the light emitting diode chip 1120 and the reflection member 1130. In this manner, the light transmitting resin 1210 protects the light emitting diode chip 1120 and the reflection member 1130 from moisture, dust, external impact, and the like. For example, the light transmitting resin may be a transparent epoxy resin or a transparent silicone resin.

In some exemplary embodiments, the light transmitting resin 1210 may include a wavelength conversion material dispersed therein.

The light transmitting resin 1210 with the wavelength conversion material dispersed therein emits white light or a certain color light through conversion of the wavelength of light emitted from the light emitting diode chip 1120.

The wavelength conversion material may be a phosphor that converts the wavelength of light. The phosphor may include yellow phosphors, red phosphors, green phosphors, and the like.

The yellow (Y) phosphors may include, for example, silicate phosphors or YAG:Ce($T_3Al_5O_{12}$:Ce) phosphors, which are cerium-doped yttrium (Y) aluminum (Al) garnets having a main wavelength of 530 nm to 570 nm.

The red (R) phosphor may include, for example, nitride phosphors or YOX ($Y_2O_3$:Eu) phosphors having a main wavelength of 611 nm and including a compound of yttrium oxide ($Y_2O_3$) and europium (Eu).

The green (G) phosphors may include, for example, LAP (LaPO$_4$:Ce,Tb) phosphors having a main wavelength of 544 nm and including a compound of phosphoric acid (PO$_4$), lanthanum (La), and terbium (Tb).

The blue (B) phosphors may include, for example, BAM (BaMgAl$_{10}$O$_{17}$:Eu) phosphors having a main wavelength of 450 nm and including a compound of barium (Ba), magnesium (Mg), aluminum oxide materials, and europium (EU).

The phosphors may include fluoride compound KSF (K$_2$SiF$_6$) phosphors, which are Mn4+-activated phosphors advantageous for high color reproduction.

As such, the wavelengths of light emitted through the side surface of the light emitting diode chip 1120 and light having passed through the reflection member 1130 may be converted by the light transmitting resin 1210 with the wavelength conversion material dispersed therein.

In some exemplary embodiments, if wavelength conversion of light emitted from the light emitting diode chip 1120 is not required, the wavelength conversion material can be omitted.

Figure 17:
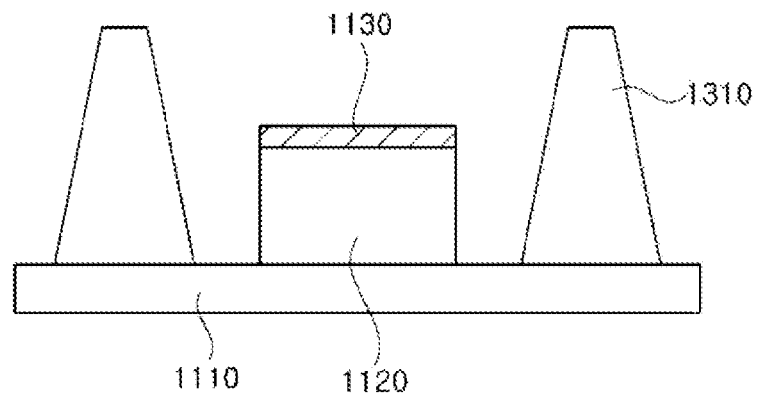
FIG. 17, FIG. 18, and FIG. 19 are schematic views of light emitting diode packages according to third to fifth exemplary embodiments.
Figure 18:
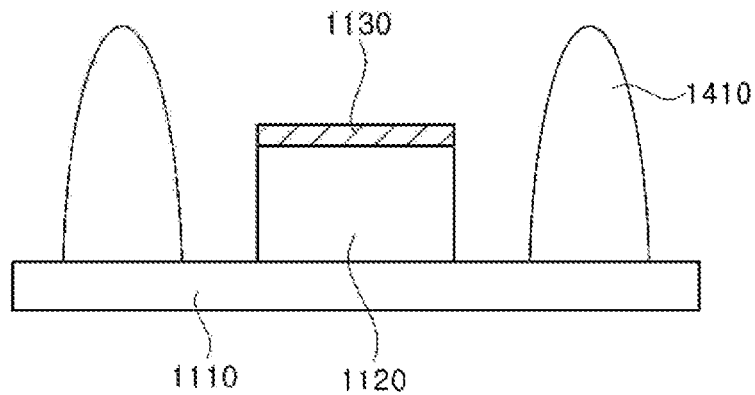
Figure 19:
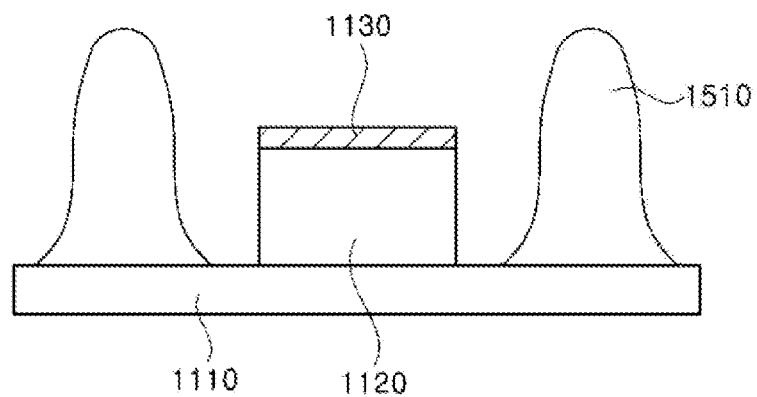

FIG. 17 to FIG. 19 are schematic views of light emitting diode packages according to third to fifth exemplary embodiments.

FIG. 17 is a cross-sectional view of a light emitting diode package 1300 according to the third exemplary embodiment, which includes a dam 1310 having a trapezoidal cross-section.

FIG. 18 is a cross-sectional view of a light emitting diode package 1400 according to the fourth exemplary embodiment, which includes a dam 1410 having a semispherical cross-section.

FIG. 19 is a cross-sectional view of a light emitting diode package 1500 according to the fifth exemplary embodiment, which includes a dam 1510 having a curved cross-section.

The dam 1140 of the light emitting diode package 1100 according to the first exemplary embodiment shown in FIG. 12 and the dam 1310 of the light emitting diode package 1300 according to the third exemplary embodiment shown in FIG. 17 can be formed using a mold through cutting, punching, injection molding, and the like. In particular, the dam 1310 of the light emitting diode package 1300 according to the third exemplary embodiment has an inclined side surface. The inclined side surface of the dam 1310 may prevent light reflected by the side surface thereof from reentering the light emitting diode chip 1120. When the dam is formed using a mold, the dams for surrounding the lateral sides of the plurality of light emitting diode chips 1120 may be simultaneously formed.

The dam 1410 of the light emitting diode package 1400 according to the fourth exemplary embodiment and the dam 1510 of the light emitting diode package 1500 according to the fifth exemplary embodiment may be formed using a dispenser. The dam 1410 of the light emitting diode package 1400 according to the fourth exemplary embodiment may be formed using a mold. When the dam is formed using the dispenser, it is possible to precisely form the dam.

In this manner, the dam may be formed to have various radii of curvature and shapes using various methods.

FIG. 20 to FIG. 23 are schematic views of light emitting diode packages according to sixth to ninth exemplary embodiments.

Figure 20:
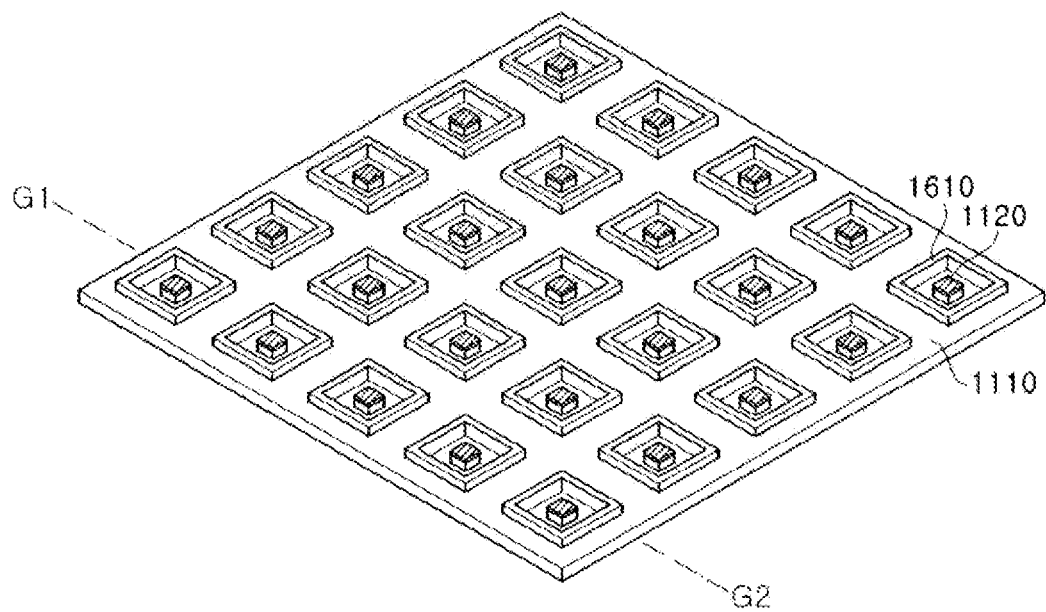
FIG. 20, FIG. 21, FIG. 22, and FIG. 23 are schematic views of light emitting diode packages according to sixth to ninth exemplary embodiments.
Figure 21:
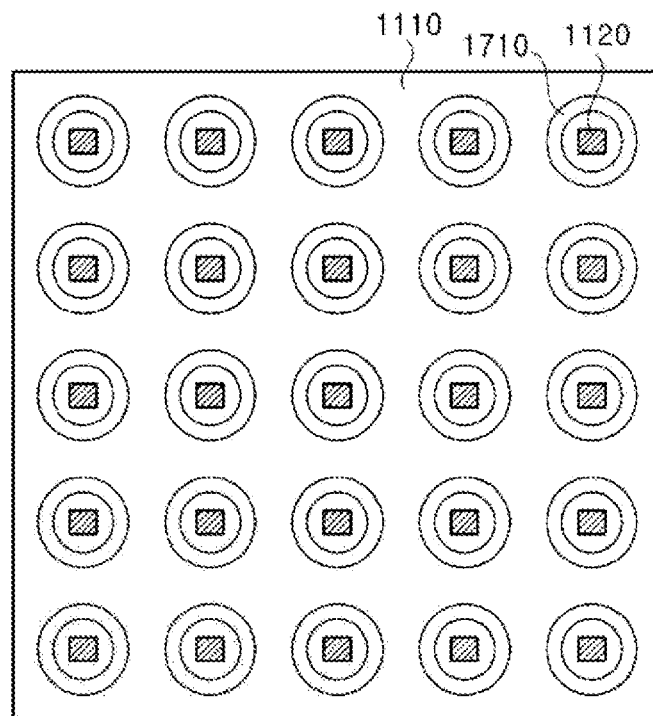
Figure 22:
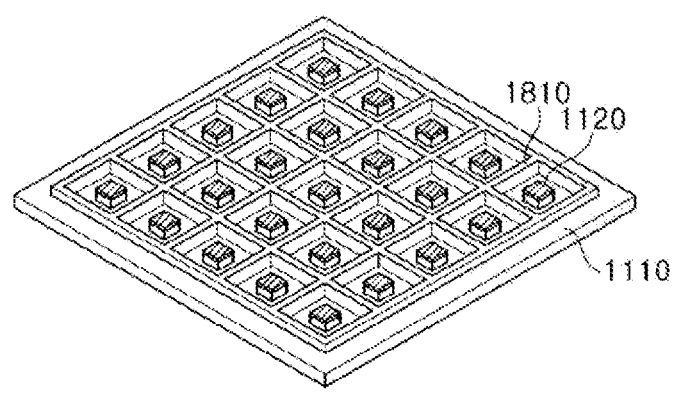
Figure 23:
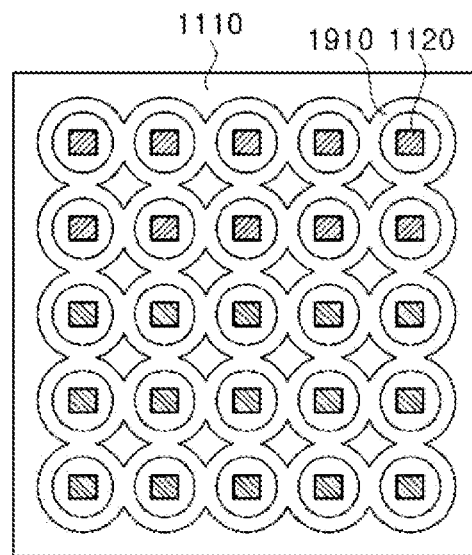

FIG. 20 and FIG. 22 are perspective views of light emitting diode packages 1600, 1800 according to the sixth and eighth exemplary embodiments, and FIG. 21 and FIG. 23 are plan views of the light emitting diode packages 1700, 1900 according to the seventh and ninth exemplary embodiments.

In the light emitting diode packages 1600, 1700, 1800, 1900 according to the sixth to ninth exemplary embodiments, multiple light emitting diode chips 1120 are disposed on the circuit board 1110. Further, the dams 1610, 1710, 1810, 1910 of the light emitting diode packages 1600, 1700, 1800, 1900 according to the sixth to ninth exemplary embodiments may have any one of various structures shown in FIG. 20 to FIG. 23.

In the light emitting diode packages 1600, 1700, 1800, 1900 shown in FIG. 20 to FIG. 23, a reflection member 1130 and a light transmitting resin 1210 formed on an upper surface of each of light emitting diode chips 1120 are not separately shown. Although not shown in FIG. 20 to FIG. 23, however, the reflection member 1130 is formed on the upper surface of the light emitting diode chip 1120 and the light transmitting resin 1210 may also be formed, as needed.

The light emitting diode packages according to the third to ninth exemplary embodiments exemplarily illustrate that the dam may be formed to have various structures. For example, the dam 1610 and 1710 between adjacent light emitting diode chips 1120 may be formed on the circuit board 1110 while being spaced apart from each other as shown in FIGS. 20 and 21. Alternatively, adjacent light emitting diode chips 1120 may share at least a portion of the dam 1810 and 1910 disposed therebetween as shown in FIGS. 22 and 23. The dam formed in the light emitting diode package is not limited to those shown in the illustrated exemplary embodiments, and may be formed in various structures.

Figure 24:
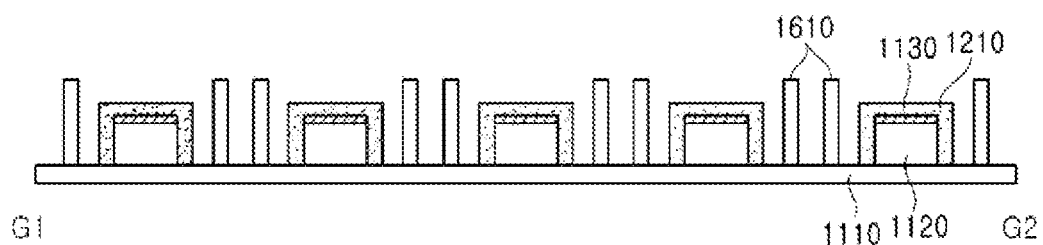
FIG. 24 is a schematic cross-sectional view of the light emitting diode package of FIG. 20.

FIG. 24 is a cross-sectional view of the light emitting diode package according to the sixth exemplary embodiment shown in FIG. 20.

The light emitting diode package 1600 according to the sixth exemplary embodiment includes multiple light emitting diode chips 1120 disposed on the circuit board 1110 and the dams 1610 surrounding the lateral side of each of the light emitting diode chips 1120, as shown in FIG. 24.

Hereinafter, a first light emitting diode chip 1120 and a second light emitting diode chip 1120 will be described as light emitting diode chips 1120 adjacent to each other.

The reflection member 1130 is formed on the upper surface of each of the first the light emitting diode chip 1120 and the second light emitting diode chip 1120. Accordingly, both the first light emitting diode chip 1120 and the second light emitting diode chip 1120 broadly emit light in the lateral direction.

According to the illustrated exemplary embodiment, some fraction of light emitted from the first light emitting diode chip 1120 is spread through an upper portion of the dam 1610 to a region in which the second light emitting diode chip 1120 is disposed. Further, the remaining fraction of light emitted from the first light emitting diode chip 1120 is blocked by the dam 1610 and does not reach the region of the second light emitting diode chip 1120. Some fraction of light emitted from the second light emitting diode chip 1120 is also spread to a region in which the first light emitting diode chip 1120 is disposed and the remaining fraction of the light emitted from the second light emitting diode chip 1120 is blocked by the dam 1610.

When the second light emitting diode chip 1120 stops light emission, the dam 1610 allows only some fraction of light emitted from the first light emitting diode chip 1120 to affect the region in which the second light emitting diode chip 1120 is disposed. If the light emitting diode package does not include the dam 1610, most of light emitted from the first light emitting diode chip 1120 and spreading towards the second light emitting diode chip 1120 affects the region of the second light emitting diode chip 1120. Accordingly, if the light emitting diode package is not provided with the dam 1610, the light emitted from the first light emitting diode chip 1120 affects the region in which the second light emitting diode chip 1120 is disposed, even when the second light emitting diode chip 1120 stops light emission.

However, the dam 1610 formed to partition the region of the first light emitting diode chip 1120 from the region of the second light emitting diode chip 1120 according to the illustrated exemplary embodiment reduces the influence of light emitted from the first or second light emitting diode chip on the region in which the first or second light emitting diode chip is disposed. Accordingly, when the second light emitting diode chip 1120 stops light emission, the amount of light emitted from the first light emitting diode chip 1120 and affecting the region of the second light emitting diode chip 1120 is reduced, thereby ensuring clearer blackout in the corresponding region.

The dam 1610 does not completely block light emitted from one light emitting diode chip and affecting a region adjacent to the one light emitting diode chip. Thus, when both the first light emitting diode chip 1120 and the second light emitting diode chip 1120 are operated to emit light, light emitted from the first light emitting diode chip 1120 and light emitted from the second light emitting diode chip 1120 are mixed in a region therebetween, whereby the light emitting diode package 1600 can emit light in a generally uniform distribution.

Figure 25:
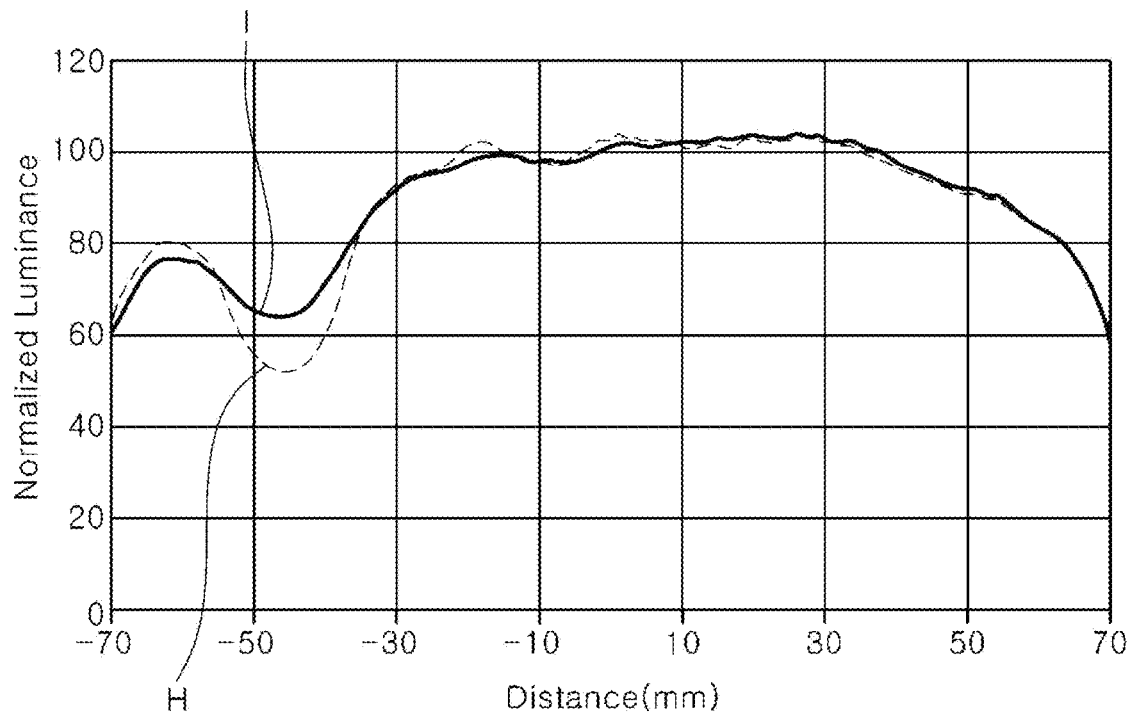
FIG. 25 is a graph comparing beam angle of the light emitting diode package according to the sixth exemplary embodiment with beam angle of a conventional light emitting diode package.

FIG. 25 is a graph comparing brightness of the light emitting diode package according to the sixth exemplary embodiment with brightness of a conventional light emitting diode package.

The light emitting diode package according to the sixth exemplary embodiment is the light emitting diode package 1600 shown in FIG. 20 and FIG. 24.

In the light emitting diode package according to the sixth exemplary embodiment, the multiple light emitting diode chips are disposed on the circuit board and the dam partitions the regions of the light emitting diode chips from each other. In this experiment, one of the multiple light emitting diode chips is turned off and does not emit light.

In the conventional light emitting diode package, the multiple light emitting diode chips are disposed on the circuit board on which the dam is not formed. In this experiment, one of the multiple light emitting diode chips is turned off and does not emit light.

The position of the light emitting diode chip in a turned-off state is the same between the light emitting diode package according to the sixth exemplary embodiment and the conventional light emitting diode package. The region of the light emitting diode chip in the turned-off state is a blackout region.

Brightness H of the light emitting diode package according to the sixth exemplary embodiment, in which the dam is formed in the blackout region, is lower than brightness I of the conventional light emitting diode package. Referring to FIG. 25, the conventional light emitting diode package has a brightness value I of 60 or more. On the other hand, the light emitting diode package according to the sixth exemplary embodiment has a brightness value H of 60 or less, for example, about 50. As such, in the blackout region, the light emitting diode package according to the sixth exemplary embodiment ensures clearer blackout than the conventional light emitting diode package.

However, in the light emitting region, the light emitting diode package according to the sixth exemplary embodiment has similar brightness to the conventional light emitting diode package.

As such, although the light emitting diode package according to the exemplary embodiments has similar brightness to that of the conventional light emitting diode package in the light emitting regions thereof, the light emitting diode package according to the exemplary embodiments can ensure clearer blackout in the blackout region thereof by the dam as compared to the conventional light emitting diode package. Accordingly, a display apparatus adopting the light emitting diode package including the dam according to the exemplary embodiments can have improved contrast.

Figure 26:
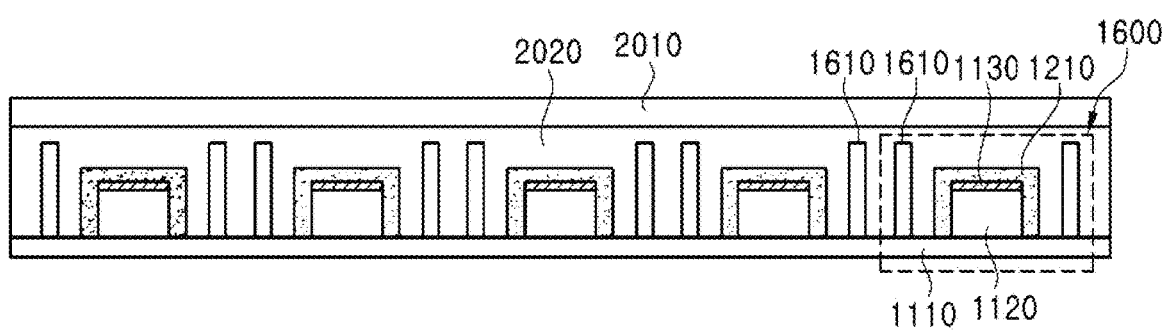
FIG. 26 is a schematic view of a backlight unit according to a first exemplary embodiment.

FIG. 26 is a schematic view of a backlight unit according to a first exemplary embodiment.

Referring to FIG. 26, a backlight unit 2000 includes a light emitting diode package 1600 and an optical member 2010.

The light emitting diode package 1600 shown in FIG. 26 may be the light emitting diode package 1600 according to the sixth exemplary embodiment. However, the inventive concepts are not limited thereto, and in other exemplary embodiments, the light emitting diode package 1600 may have the structure of any one of the light emitting diode packages according to the other exemplary embodiments described above.

The optical member 2010 is disposed on the light emitting diode package 1600. The optical member 2010 may be a light guide plate or an optical sheet, such as a diffusion sheet, a quantum dot (QD) sheet, a diffusion sheet, a reflective film, a phosphor sheet, a prism sheet, a brightness enhancement film (BEF), a dual brightness enhancement film (DBEF), and the like. Alternatively, in some exemplary embodiments, both the light guide plate and the optical sheet may be disposed on the light emitting diode package 1600.

In a space between the light emitting diode package 1600 and the optical member 2010, light emitted from the multiple light emitting diode chips 1120 may be mixed. The backlight unit 2000 may emit substantially uniform light through mixture of light emitted from the multiple light emitting diode chips 1120.

A sealing member 2020 may be disposed in the space between the light emitting diode package 1600 and the optical member 2010. The sealing member 2020 may be formed of a light transmitting resin and fills the space between the light emitting diode package 1600 and the optical member 2010. The sealing member 2020 may protect the light emitting diode package 1600 from moisture, dust, external impact, and the like.

In some exemplary embodiments, the sealing member 2020 may include a light diffuser dispersed therein. The light diffuser may provide more efficient mixture of light inside the sealing member 2020. Accordingly, the space for mixture of light can be reduced, thereby reducing the thickness of the backlight unit 2000.

Figure 27:
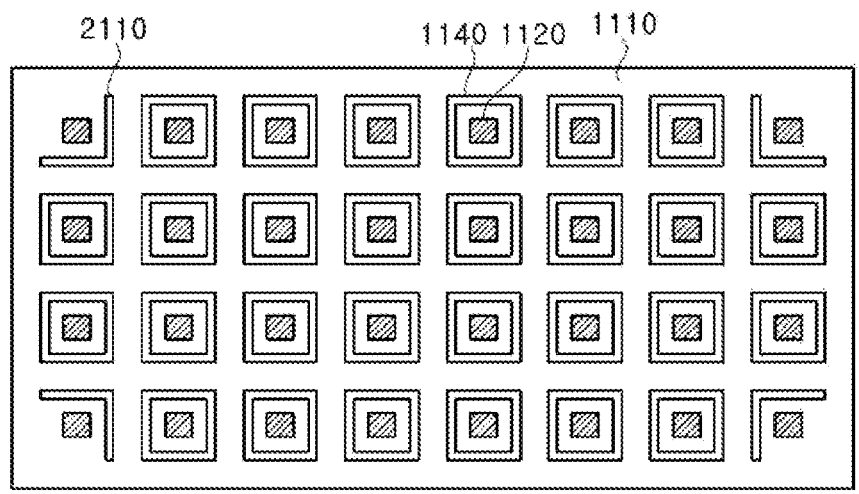
FIG. 27 and FIG. 28 are schematic views of backlight units according to second and third exemplary embodiments.
Figure 28:
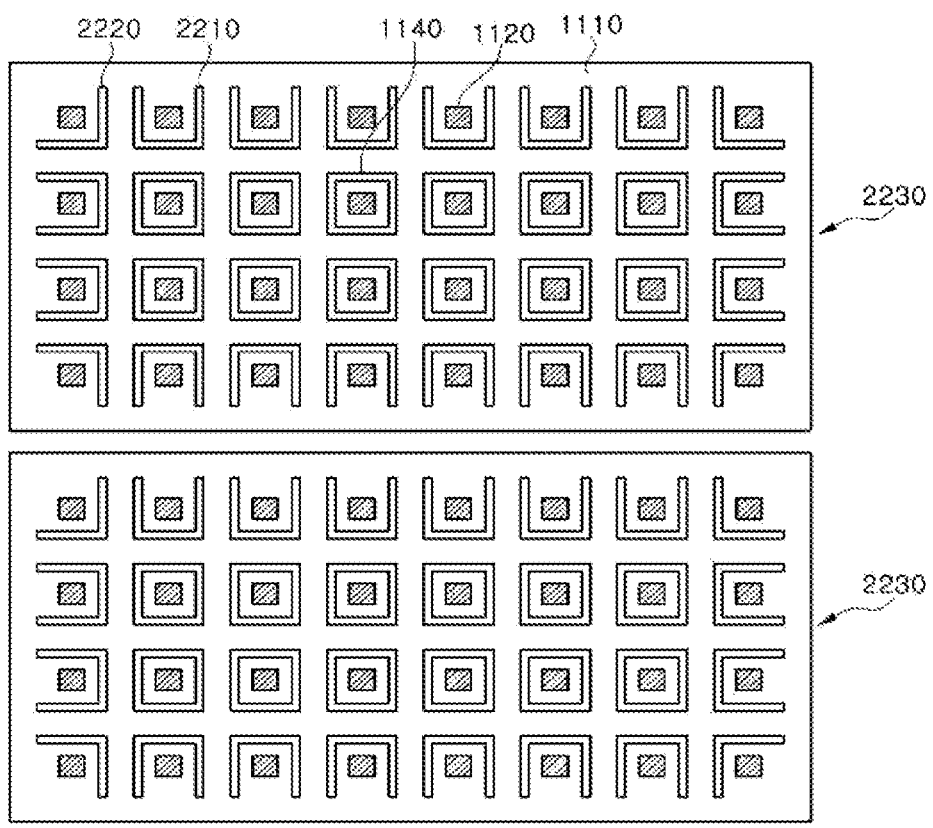

FIG. 27 and FIG. 28 are schematic views of backlight units according to second and third exemplary embodiments.

A backlight unit 2100 according to the second exemplary embodiment and a backlight unit 2200 according to the third exemplary embodiment may be formed with dams 2110; 2210, 2220 each having a modified structure. Except for the modified dams 2110; 2210, 2220, other dams 1140 may have the same structure as the dam 1140 according to the first or sixth exemplary embodiment described above. Hereinafter, the optical member, the reflection member, and the light transmitting resin will not be shown in the drawings for better illustration of the structure of the backlight unit.

Referring to FIG. 27, in the backlight unit 2100 according to the second exemplary embodiment, the dam 2110 is formed at each corner of the circuit board 1110 to be partially open towards the corner of the circuit board 1110. A distance between the corner of the circuit board 1110 and the light emitting diode chip 1120 near the corner of the circuit board 1110 is greater than a distance between one side of the circuit board 1110 and the light emitting diode chip 1120 near the one side of the circuit board 1110. More particularly, the light emitting diode chip 1120 near the corner of the circuit board 1110 emits light over a greater region than other light emitting diode chips 1120. Accordingly, in order to allow light to spread to the corner of the circuit board 1110, the dam 2110 has an open structure at a portion thereof facing the corner of the circuit board 1110.

Referring to FIG. 28, the backlight unit 2200 according to the third exemplary embodiment includes multiple light emitting diode packages 2230. In each of the light emitting diode packages 2230, the dams 2210, 2220 partially surround the light emitting diode chips 1120 disposed near the corners of the circuit board 1110 and the light emitting diode chips disposed near each side of the circuit board 1110, and are open towards the corners and sides of the circuit board 1110.

The light emitting diode chips 1120 disposed in an inner region of the circuit board 1110 are adjacent to each other in all directions. However, the light emitting diode chips 1120 disposed along the periphery of the circuit board 1110 do not have adjacent light emitting diode chip 1120 towards the periphery of the circuit board 1110. Accordingly, in order to spread light towards the periphery of the circuit board 1110, the dams 2210, 2220 are formed to be open towards the periphery of the circuit board 1110.

The multiple light emitting diode packages 2230 may be spaced apart from each other, or a reflective sheet may be disposed between the light emitting diode packages 2230. As such, the dam 2210 is open towards a space between the multiple light emitting diode packages 2230 to spread light to the space between the multiple light emitting diode packages 2230. As such, the dam 2210 that may otherwise make the space between the multiple light emitting diode packages 2230 darker than the light emitting diode packages 2230 may be obviated to secure uniform brightness of the backlight unit 2200.

Figure 29:
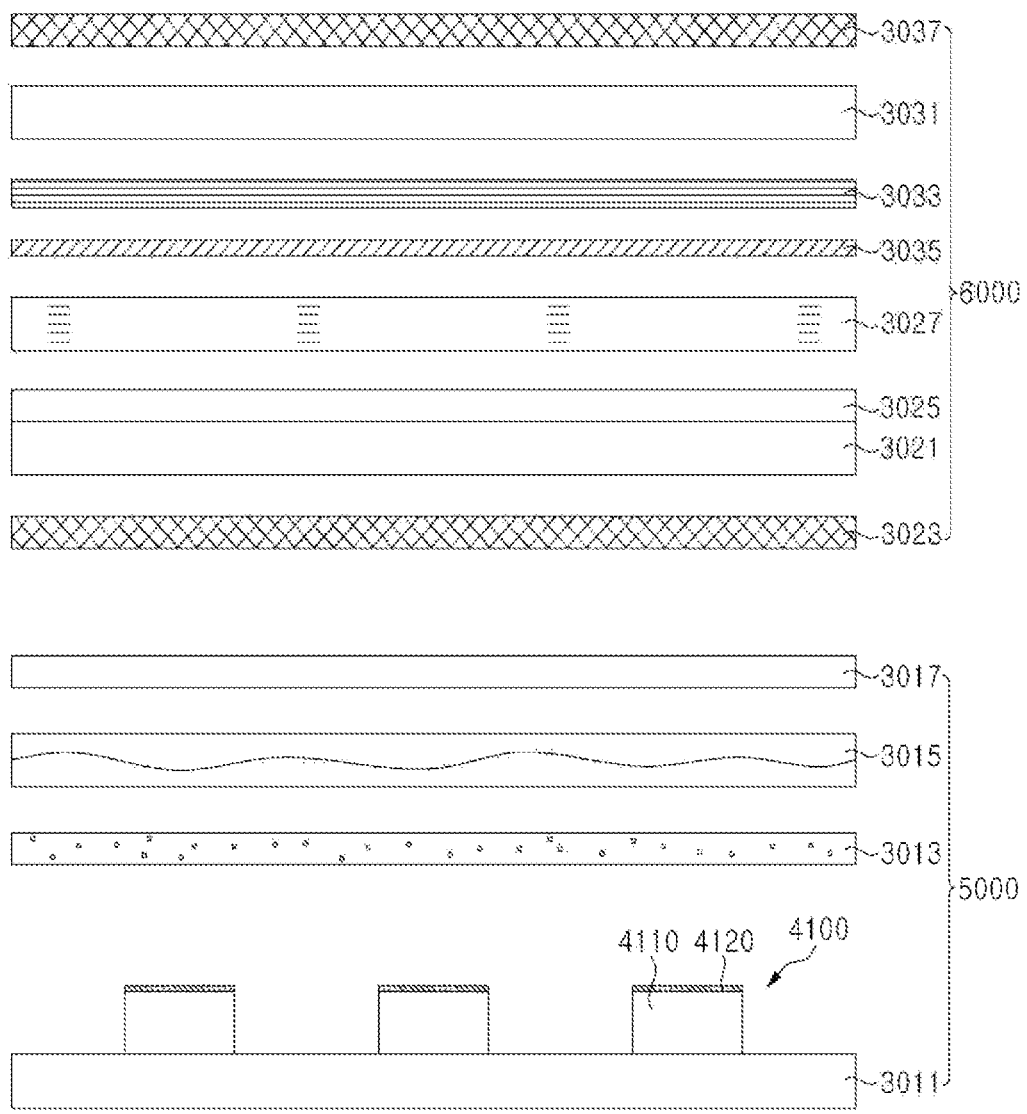
FIG. 29 is a schematic partially exploded sectional view of a liquid crystal display according to an exemplary embodiment.
Figure 30:
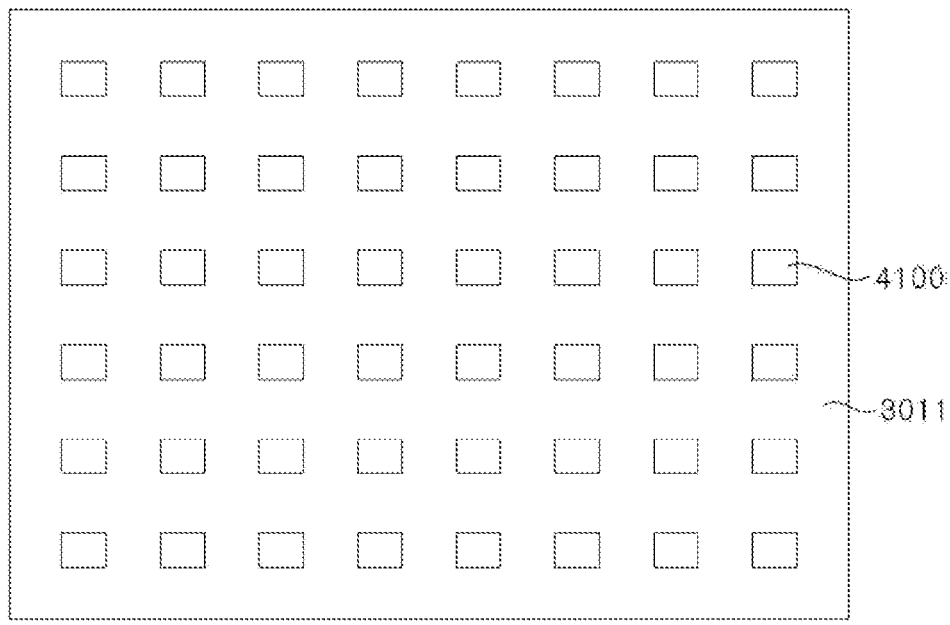
FIG. 30 is a schematic plan view of a circuit board on which light emitting devices are arranged according to an exemplary embodiment.

FIG. 29 is a schematic partially exploded cross-sectional view of a liquid crystal display according to an exemplary embodiment, and FIG. 30 is a schematic plan view of a circuit board on which light emitting devices are arranged.

Referring to FIG. 29 and FIG. 30, the liquid crystal display includes a backlight unit 5000 and a display panel 6000. The backlight unit 5000 includes a circuit board 3011, light emitting devices 4100, a wavelength conversion sheet 3013, a combined optical sheet 3015, and a protective sheet 3017. The display panel 6000 may include a lower polarization film 3023, a lower substrate 3021, a thin film transistor 3025, a liquid crystal layer 3027, a transparent electrode 3035, a color filter 3033, an upper substrate 3031, and an upper polarization film 3037.

The circuit board 3011 may include a circuit pattern formed on an upper surface or in the interior thereof. In particular, the circuit board 3011 may include a circuit pattern electrically connected to each of the light emitting devices 4100, such that the light emitting devices 4100 can be independently driven.

As shown in FIG. 30, the light emitting devices 4100 are arranged on the circuit board 3011. The light emitting devices 4100 may be arranged in a matrix. In particular, the light emitting devices 4100 are spaced apart from each other to implement local dimming.

Each of the light emitting devices 4100 includes a light emitting diode chip 4110 and a light reflection member 4120 formed on an upper surface of the light emitting diode chip 4110. In the illustrated exemplary embodiment, the light emitting diode chip 4110 emits light through the upper and side surfaces thereof. The light emitting diode chip 4110 is a semiconductor device having a light emitting structure formed on a growth substrate, and has a flip-chip structure having electrode pads formed on a lower surface thereof. However, the inventive concepts are not limited to a particular structure of the light emitting diode chip 4110, and in other exemplary embodiments, the light emitting diode chips 4110 may have various structures, such as a horizontal type, a vertical type, and the like.

The light reflection member 4120 reflects light emitted through the upper surface of the light emitting diode chip 4110, such that light reflected by the light reflection member 4120 enters back to the light emitting diode chip 4110 and is discharged through the side surface of the light emitting diode chip 4110. As such, the direct-lighting type backlight unit can broadly spread light emitted from the light emitting devices 4100 in the lateral direction, thereby increasing a luminous area of the light emitting devices 4100.

The light reflection member 4120 may be formed of any material capable of reflecting light emitted from the light emitting diode chip 4110. For example, the light reflection member 4120 may be a distributed Bragg reflector (DBR). The DBR may include a dielectric layer, such as $SiO_2$, $TiO_2$, SiN, and the like, and may be formed by alternately stacking layers having different indices of refraction. Alternatively, the light reflection member 4120 may include a metal reflector. For example, a metal reflection layer, such as Ag and Al, may be formed on the upper surface of the light emitting diode chip 4110. Still alternatively, the light reflection member 4120 may include both the DBR and the metal reflection layer. In particular, the DBR may have higher reflectivity than the metal reflector to reduce light loss due to reflection of light.

The light reflection member 4120 may be formed together with the light emitting diode chip 4110 in a process of manufacturing the light emitting diode chip 4110. In particular, the light reflection member 4120 may be formed before individually dicing the light emitting diode chips 4110. Accordingly, the light emitting diode chip 4110 may be considered as including the light reflection member 120. Hereinafter, the light emitting diode chip 4110 having an upper surface through which light is emitted and the light reflection member 120 formed thereon will be separately described.

The wavelength conversion sheet 3013 is disposed on the light emitting devices 4100 and converts the wavelength of light emitted from the light emitting devices 4100 through absorption. The wavelength conversion sheet 3013 may include a phosphor or a quantum dot.

The combined optical sheet 3015 is formed by combining at least two optical sheets into a single sheet, and performs a combined optical function. In the illustrated exemplary embodiment, the combined optical sheet 3015 may include, for example, a prism sheet, a fine lens sheet, a diffusion sheet, and the like. Other examples of the combined optical sheet 3015 will be described below in detail with reference to FIG. 34 to FIG. 39.

The protective sheet 3017 is disposed on the combined optical sheet 3015 to protect the combined optical sheet 3015. In some exemplary embodiments, the protective sheet 3017 may be integrated into the combined optical sheet 3015 or may be omitted.

The display panel 6000 displays an image using light emitted from the backlight unit 5000. The display panel 6000 includes the liquid crystal layer 3027 interposed between the lower substrate 3021 and the upper substrate 3031, and employs the lower polarization film 3023 and the upper polarization film 3037 to allow transmission of light or to block light.

The lower substrate 3021 and the upper substrate 3031 may be glass substrates. An active device, such as a thin film transistor, may be formed on the lower substrate 3021, and the transparent electrode 3035 is formed under the upper substrate 3031 to control an alignment direction of liquid crystals in the liquid crystal layer 3027.

The color filter 3033 may include red, green, and blue color filters to realize a natural color image.

Although the display panel according to the illustrated exemplary embodiment is described as having the thin film transistor 3025 formed under the liquid crystal layer 3027 and the transparent electrode 3035 formed on the liquid crystal layer 3027, the inventive concepts are not limited thereto and the display panel may have various structures.

According to the illustrated exemplary embodiment, the backlight unit employs the light emitting devices 4100 each including the light reflection member 4120 formed on the upper surface of the light emitting diode chip 4110, thereby enabling broad spreading of light. As such, a diffusion lens used in a conventional backlight unit can be obviated. In addition, since the backlight unit allows individual operation of the light emitting devices 4100, the backlight unit can reduce power consumption while increasing contrast ratio by locally adjusting an output of the light emitting devices 4100 or locally turning off the light emitting devices 4100 through local dimming.

Furthermore, the backlight unit adopts both the light emitting devices 4100 and the combined optical sheet 3015 to achieve substantial reduction in thickness thereof, thereby reducing the thickness of the liquid crystal display.

Although the wavelength conversion sheet 3013 is illustrated as being disposed on the light emitting devices 4100 in the illustrated exemplary embodiment, the light emitting devices 4100 may include a wavelength conversion member and the wavelength conversion sheet 3013 may be omitted in other exemplary embodiments.

Figure 31:
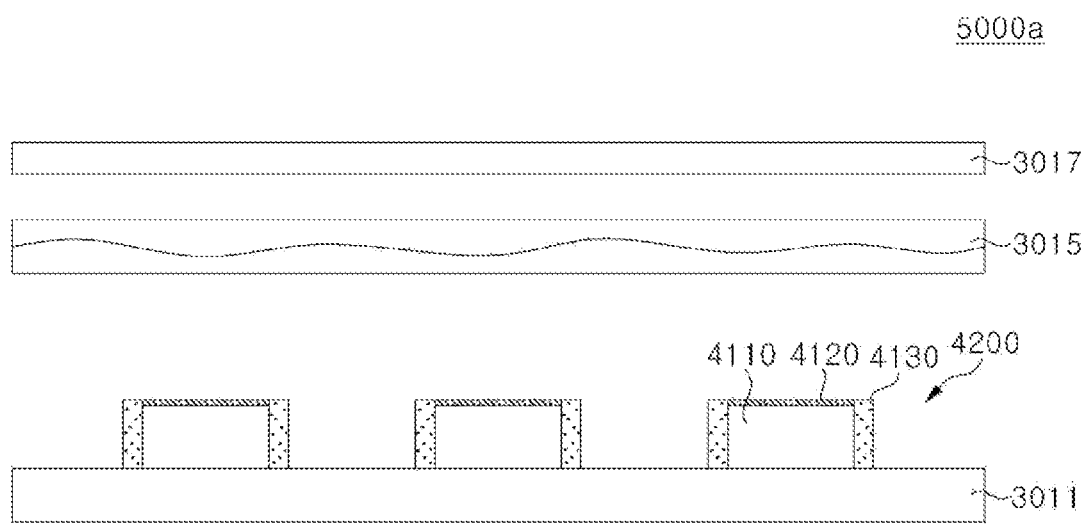
FIG. 31 is a schematic partially exploded sectional view of a backlight unit of a liquid crystal display according to another exemplary embodiment.
Figure 32:
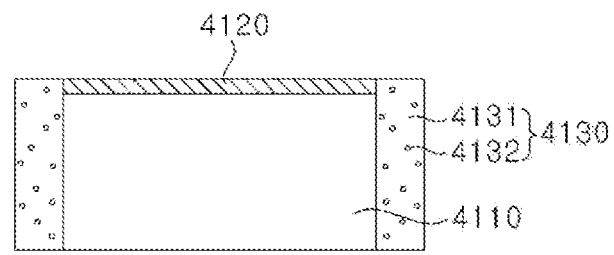
FIG. 32 is a schematic enlarged cross-sectional view of a light emitting device applied to the backlight unit shown in FIG. 31.

FIG. 31 is a schematic partially exploded cross-sectional view of a backlight unit of a liquid crystal display according to another exemplary embodiment, and FIG. 32 is a schematic enlarged cross-sectional view of a light emitting device 4200 applied to the backlight unit shown in FIG. 31.

Referring to FIG. 31 and FIG. 32, although a backlight unit 5000a according to the illustrated exemplary embodiment is generally similar to the backlight unit 5000 described with reference to FIG. 29, the backlight unit 5000a is different from the backlight unit 5000 in that the backlight unit 5000a does not include the wavelength conversion sheet 3013 and each of the light emitting devices 4200 includes a wavelength conversion member 4130. More particularly, each of the light emitting devices 4200 may include a light emitting diode chip 4110, a light reflection member 4120, and the wavelength conversion member 4130. Hereinafter, detailed descriptions of the same components already described above will be omitted to avoid redundancy, and the following descriptions will focus on different features.

The wavelength conversion member 4130 may convert the wavelength of light emitted from the light emitting diode chip 4110. The wavelength conversion member 4130 may cover a side surface of the light emitting diode chip 4110 and a side surface of the light reflection member 4120.

The wavelength conversion member 4130 includes a light transmitting resin 4131 and a wavelength conversion material 4132 dispersed in the light transmitting resin 4131. For example, the light transmitting resin 4131 may be formed of a light transmitting material, such as an epoxy resin, a silicone resin, and the like. For example, the wavelength conversion material 4132 may include phosphors or quantum dots. The phosphor refers to an inorganic or organic compound that converts light absorbed by the light emitting diode chip 4110 into light having a different wavelength depending upon difference in energy level of a compound forming the phosphor. Further, the quantum dot refers to a semiconductor nanocrystal that converts the absorbed light into light having a different wavelength depending upon the magnitude of a band gap.

As such, the wavelength of light emitted through the side surface of the light emitting diode chip 4110 is converted by the wavelength conversion member 4130, which covers the side surfaces of the light emitting diode chip 4110 and the light reflection member 4120. Accordingly, light subjected to wavelength conversion by the wavelength conversion material is emitted through the side surface of the light emitting device 4200. Furthermore, some fraction of light emitted from the light emitting diode chip 4110 may be emitted through the side surface of the light emitting device 4100 without wavelength conversion.

According to the illustrated exemplary embodiment, since the light emitting device 4200 emits light subjected to wavelength conversion, the wavelength conversion sheet 3013 (see FIG. 29) may be obviated from a display apparatus. The wavelength conversion member 4130 may not only convert the wavelength of light, but also protect the light emitting diode chip 4110 from external materials, such as moisture, dust, and the like. In addition, the wavelength conversion member 4130 may protect the light emitting diode chip 4110 from external impact.

Each of the light emitting devices 4200 may include the same wavelength conversion material 4132 and may emit light having the same color, for example, white light. However, the inventive concepts are not limited thereto. For example, in some exemplary embodiments, the light emitting devices 4200 may include different wavelength conversion materials from each other, and thus may emit light having different colors. Furthermore, a certain light emitting device 4200 may not include the wavelength conversion material 4132 depending upon a desired color of light. For example, in the light emitting diode chip 4110 adapted to emit blue light, a separate wavelength conversion material may be obviated to emit blue light directly from the light emitting device 4200 without wavelength conversion.

According to the illustrated exemplary embodiment, the wavelength conversion sheet 3013 may be omitted, thereby enabling further reduction in thickness of the backlight unit.

Figure 33:
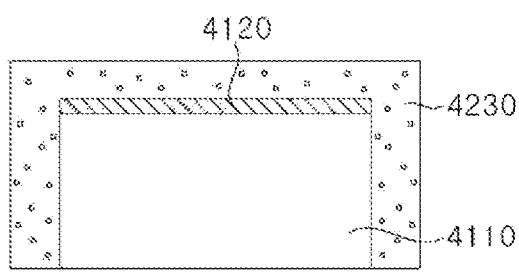
FIG. 33 is a schematic cross-sectional view of a light emitting device according to another exemplary embodiment applied to a backlight unit.

FIG. 33 is a schematic cross-sectional view of a light emitting device 4400 according to a further exemplary embodiment applied to a backlight unit.

Referring to FIG. 33, although the light emitting device 4400 according to the illustrated exemplary embodiment is similar to the light emitting device 4200 described with reference to FIG. 32, the light emitting device 4400 is different from the light emitting device 4200 in that a wavelength conversion member 4230 of the light emitting device 4400 covers a light reflection member 4120 thereof.

In the light emitting device 4200 of FIG. 32, the wavelength conversion member 4130 exposes the upper surface of the light reflection member 4120, whereas the wavelength conversion member 4230 in the illustrated exemplary embodiment covers the upper surface of the light reflection member 4120. More particularly, the wavelength conversion member 4230 is formed to cover the side surface of the light emitting diode chip 4110 and the upper and side surfaces of the light reflection member 4120.

The wavelength conversion member 4230 formed on the upper surface of the light reflection member 4120 may have the same thickness as the wavelength conversion member 4230 formed on the side surface of the light emitting diode chip 4110, without being limited thereto. In particular, the wavelength conversion member 4230 formed on the upper surface of the light reflection member 4120 may have a smaller thickness than the wavelength conversion member 4230 formed on the side surface of the light emitting diode chip 4110.

In the light emitting device 4200 shown in FIG. 32, the upper surface of the light reflection member 4120 is exposed, which may cause damage to the light reflection member 4120. In addition, when the light emitting device 4200 is subjected to external impact, the light reflection member 4120 may be separated from the light emitting diode chip 4110.

However, in the light emitting device 4400 according to the illustrated exemplary embodiment, since the wavelength conversion member 4230 covers both the light emitting diode chip 4110 and the light reflection member 4120, the light reflection member 4120 may be prevented or at least be suppressed from being damaged or being separated from the light emitting diode chip 4110 upon application of external impact thereto.

The light emitting device applied to the backlight unit is not limited to the light emitting devices shown in FIG. 32 and FIG. 33. The light emitting devices according to the exemplary embodiments described above may be applied to the backlight unit.

FIG. 34 to FIG. 39 are schematic cross-sectional views of a combined optical sheet according to exemplary embodiments.

Figure 34:
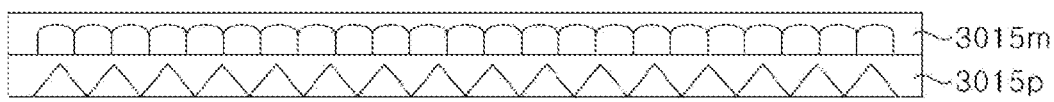
FIG. 34, FIG. 35, FIG. 36, FIG. 37, FIG. 38, and FIG. 39 are schematic cross-sectional views of a combined optical sheet according to exemplary embodiments.

Referring to FIG. 34, the combined optical sheet may include a prism sheet 3015*p* and a fine lens sheet 3015*m*. The prism sheet 3015*p* and the fine lens sheet 3015*m* may be integrated into a single combined sheet through, for example, a bonding layer. The fine lens sheet 3015*m* may be disposed on an upper surface of the prism sheet 3015*p*, or vice versa.

Figure 35:

Referring to FIG. 35, the combined optical sheet may include a prism sheet 3015*p* and a diffusion sheet 3015*d*. The prism sheet 3015*p* and the diffusion sheet 3015*d* may be integrated into a single combined sheet through, for example, a bonding layer. The diffusion sheet 3015*d* may be disposed on an upper surface of the prism sheet 3015*p*, or vice versa. Alternatively, when the diffusion sheet 3015*d* has a flat upper surface and the prism sheet 3015*p* is disposed thereon, the protective sheet 3017 of FIG. 29 may be omitted.

Figure 36:

Referring to FIG. 36, the combined optical sheet may include a first prism sheet 3015*p*1 and a second prism sheet 3015*p*2. The first prism sheet 3015*p*1 and the second prism sheet 3015*p*2 may be disposed to have prism directions orthogonal to each other. The first prism sheet 3015*p*1 and the second prism sheet 3015*p*2 may be integrated into a single combined sheet through a bonding layer.

Figure 37:

Referring to FIG. 37, the combined optical sheet may include a prism sheet 3015*p* and a polarization film 3023*a*. As the polarization film 3023*a* is integrated into the combined optical sheet, the lower polarization film 3023 of FIG. 29 may be omitted together with the protective sheet 3017.

Figure 38:
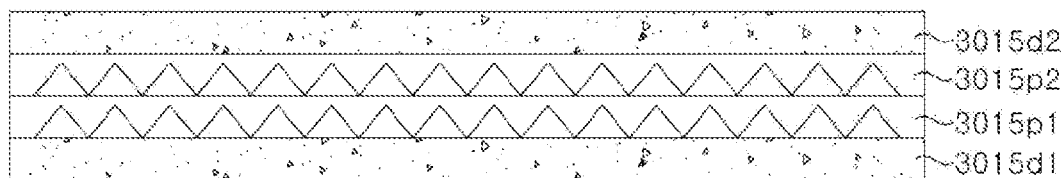

Referring to FIG. 38, the combined optical sheet may include two diffusion sheets 3015*d*1, 3015*d*2 and two prism sheets 3015*p*1, 3015*p*2. The diffusion sheets 3015*d*1, 3015*d*2 and the prism sheets 3015*p*1, 3015*p*2 may be integrated with one another through bonding layers. As shown in the drawings, the two prism sheets 3015*p*1, 3015*p*2 may be disposed between the two diffusion sheets 3015*d*1, 3015*d*2, without being limited thereto.

Figure 39:
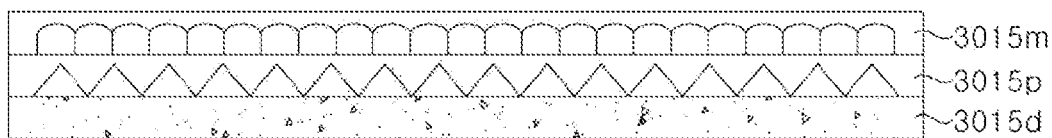

Referring to FIG. 39, the combined optical sheet may include a diffusion sheet 3015*d*, a prism sheet 3015*p*, and a fine lens sheet 3015*m*. The diffusion sheet 3015*d*, the prism sheet 3015*p*, and the fine lens sheet 3015*m* may be integrated into one combined sheet through bonding layers. The combined sequence of these sheets may be changed.

Although some combined optical sheets are described above, the inventive concepts are not limited thereto. In some exemplary embodiments, the combined optical sheet may include at least two sheets selected from among, for example, a prism sheet, a fine lens sheet, a diffusion sheet, a polarization film, and a wavelength conversion sheet, and may include the same kind of sheet.

According to exemplary embodiments, a light emitting device may include a light reflection member and a light blocking member on a light emitting diode chip to reflect light having passed through an upper surface of the light emitting diode chip to be emitted through a side surface of the light emitting chip. Accordingly, the light emitting device according to the exemplary embodiments spreads light over a broader region through the side surface of the light emitting diode chip while suppressing light emission in an upward direction, thereby suppressing a spot phenomenon while improving luminous uniformity.

According to exemplary embodiments, each of a light emitting diode package and a backlight unit may include a dam formed to surround a lateral side of a light emitting diode chip, thereby ensuring clear difference in contrast ratio depending upon on/off operation of an individual light emitting diode chip.

According to exemplary embodiments, each of the light emitting devices may include a distributed Bragg reflector on an upper surface thereof to emit light through a side surface of the light emitting device, thereby ensuring broad distribution of light without using a separate diffusion lens. In addition, the distance between the light emitting devices can be freely adjusted, thereby enabling arrangement of the light emitting devices suitable for local dimming. Furthermore, the backlight unit and the liquid crystal display may employ the light emitting devices and a combined optical sheet, thereby enabling reduction in thickness thereof.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display module, comprising:
a circuit board having an electric pattern;
a plurality of light emitters disposed on the circuit board; and
a plurality of optical layers disposed on the circuit board,
wherein at least one of the plurality of light emitters includes a light emitting diode including a first conductivity type semiconductor layer, a second conductivity type semiconductor layer, and an active layer disposed between the first conductivity type semiconductor layer and the second conductivity type semiconductor layer,
wherein the plurality of optical layers is disposed on at least one of the plurality of light emitters, the plurality of optical layers including a light transfer layer, a light reflection layer, and a light block layer, and
wherein the light block layer includes a region covering at least a region of the light reflection layer and a region of the light transfer layer.

2. The display module of claim 1, wherein the light transfer layer covers a side of the reflection layer.

3. The display module of claim 1, further comprising a wavelength conversion layer that covers at least one of the plurality of light emitters.

4. The display module of claim 1, wherein the light block layer includes a black or white resin.

5. The display module of claim 1, further comprising a dam disposed on the circuit board,
wherein the dam covers a side of the light emitting diode.

6. The display module of claim 5, wherein an angle from an optical axis of a light emission surface of the light emitting diode to an upper corner of an inner wall of the dam is greater than a peak beam angle of the light emitting diode.

7. The display module of claim 1, wherein the plurality of light emitters is spaced apart from at least one of the plurality of optical layers.

8. A display module, comprising:
a circuit board having an electric pattern;
a plurality of light emitters disposed on the circuit board; and
a plurality of optical layers disposed on the circuit board,
wherein at least one of the plurality of light emitters includes a light emitting diode disposed on the circuit board, the light emitting diode including a first conductivity type semiconductor layer, a second conductivity type semiconductor layer, and an active layer disposed between the first conductivity type semiconductor layer and the second conductivity type semiconductor layer,
wherein the plurality of optical layers includes a wavelength conversion layer, a light reflection layer, and a light block layer, and
wherein the wavelength conversion layer covers a region of the light reflection layer, and the light reflection layer is spaced apart from the light block layer.

9. The display module of claim 8, wherein the wavelength conversion layer includes a light transmitting resin.

10. The display module of claim 9, wherein the wavelength conversion layer includes a region having a different thickness.

11. The display module of claim 8, wherein the light block layer includes a black resin or a white resin.

12. The display module of claim 8, wherein the plurality of optical layers further includes a light transfer layer.

13. The display module of claim 12, wherein the light transfer layer covers a region of the light emitting diode.

14. The display module of claim 8, wherein each of the plurality of light emitters is independently driven.

15. A display module, comprising:
a circuit board having an electric pattern;
a plurality of light emitters disposed on the circuit board; and
a plurality of optical layers disposed on the circuit board,
wherein at least one of the plurality of light emitters includes a light emitting diode, a first conductivity type semiconductor layer, a second conductivity type semiconductor layer, and an active layer disposed between the first conductivity type semiconductor layer and the second conductivity type semiconductor layer,
wherein the plurality of optical layers includes a light reflection layer, a light block layer, and a wavelength conversion layer; and
wherein the wavelength conversion layer covers a region of the light emitter, and the light block layer is spaced apart from the light emitter by the wavelength conversion layer.

16. The display module of claim 15, wherein the wavelength conversion layer includes a light transmitting resin.

17. The display module of claim 16, wherein the wavelength conversion layer includes a region having a different thickness.

18. The display module of claim 17, wherein the wavelength conversion layer includes a stepped region.

19. The display module of claim 15, wherein the light block layer includes a black resin or a white resin.

20. The display module of claim 15, wherein the light reflection layer includes a region having a smaller thickness than the wavelength conversion layer.

* * * * *